(12) United States Patent
Makino et al.

(10) Patent No.: US 7,755,776 B2
(45) Date of Patent: Jul. 13, 2010

(54) INSPECTION SYSTEM AND INSPECTION METHOD

(75) Inventors: Hiroshi Makino, Kokubunji (JP);
Masaki Hasegawa, Sayama (JP);
Momoyo Enyama, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 682 days.

(21) Appl. No.: 11/703,154

(22) Filed: Feb. 7, 2007

(65) Prior Publication Data

US 2008/0073533 A1    Mar. 27, 2008

(30) Foreign Application Priority Data

Feb. 27, 2006    (JP)    ............................. 2006-050853

(51) Int. Cl.
*G01B 11/28* (2006.01)
(52) U.S. Cl. .................................... 356/630; 356/237.2
(58) Field of Classification Search ........................ None
See application file for complete search history.

(56) References Cited

U.S. PATENT DOCUMENTS 5,986,263 A * 11/1999 Hiroi et al. .................. 250/310

6,797,954 B2    9/2004 Shinada et al.

FOREIGN PATENT DOCUMENTS

JP    11-108864    10/1997

* cited by examiner

*Primary Examiner*—Gregory J Toatley, Jr.
*Assistant Examiner*—Juan D Valentin
(74) *Attorney, Agent, or Firm*—Stites & Harbison PLLC; Juan Carlos A. Marquez, Esq.

(57) ABSTRACT

There is a need for inspecting a heightwise variation in a sample. A holder holds a sample. A charge control unit charges the sample held by the holder. A retarding power supply applies a voltage to the sample held by the holder. An electro-optic system radiates an electron beam to the sample applied with a voltage by the retarding power supply and images a mirror electron returning near the surface of the sample. An image processing unit processes a mirror image resulting from imaging the mirror electron. The image processing unit outputs information corresponding to a difference between mirror images, i.e., a mirror image acquired by imaging the mirror electron and a mirror image for a prepared standard preparation, as a heightwise variation in a sample.

9 Claims, 18 Drawing Sheets

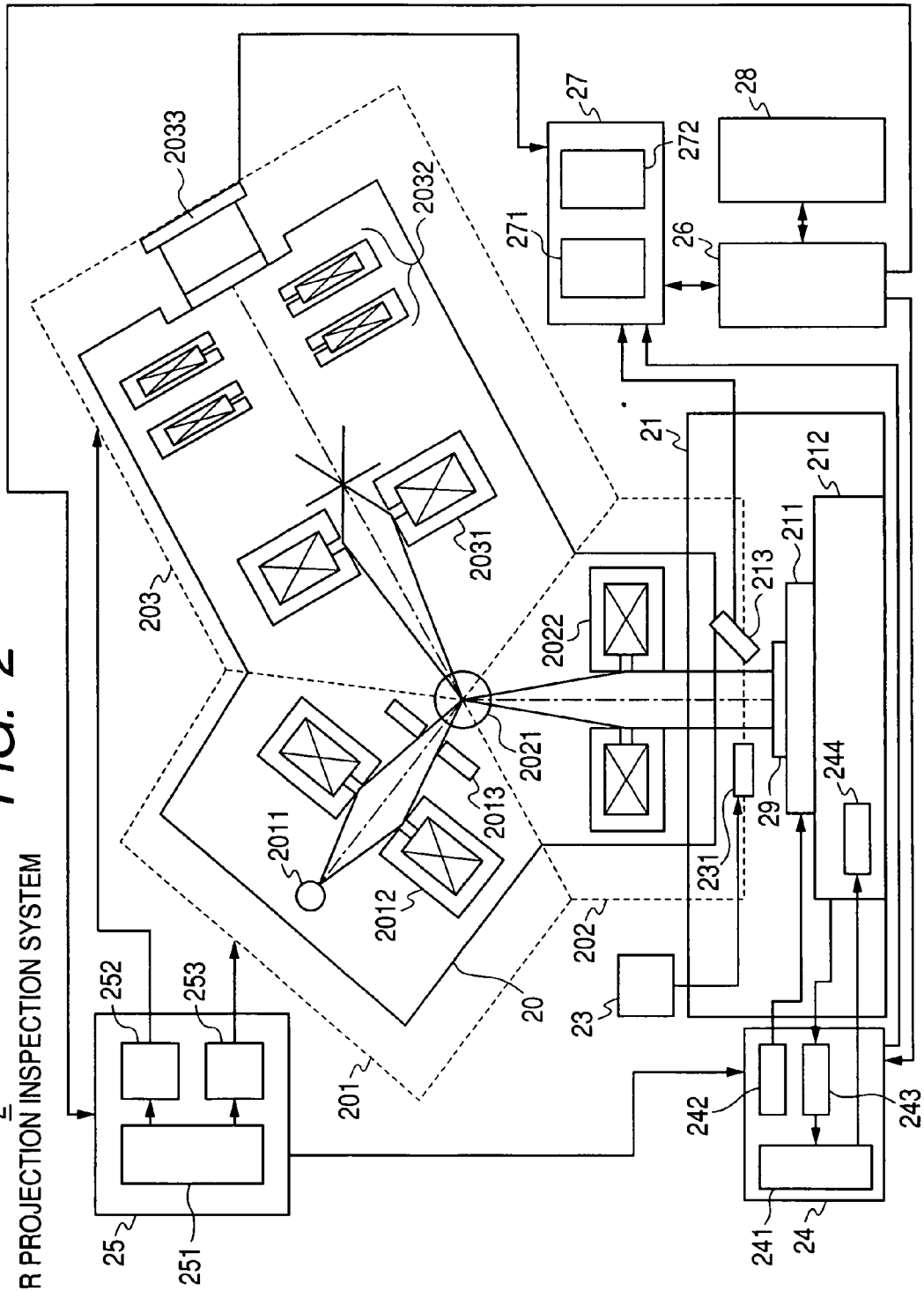

United States Patent

INSPECTION SYSTEM AND INSPECTION METHOD

CLAIM OF PRIORITY

The present application claims priority from Japanese Patent application JP 2006-050853 filed on Feb. 27, 2006, the content of which is hereby incorporated by reference into this application.

FIELD OF THE INVENTION

The present invention relates to a technology of inspecting a height variation of a sample such as a semiconductor device.

BACKGROUND OF THE INVENTION

There is known a technology of measuring a circuit pattern state in the middle of a manufacturing process of semiconductor devices. This technology is positioned to be critical to the manufacturing yield improvement and the quality management. The critical dimension measurement SEM (Scanning Electron Microscopy) for measuring circuit pattern dimensions is one of technologies for measuring circuit pattern states. The critical dimension measurement SEM uses a high resolution and a long focal depth specific to SEM to measure dimensions in a transverse direction (in-plane direction) of a circuit pattern and realizes the sub-nanometer measurement accuracy.

The mirror projection inspection system (e.g., see Japanese Patent Application No. 108864/1999) for detecting an electric characteristic failure on a circuit pattern is one of technologies for measuring circuit pattern states. The mirror projection inspection system radiates a planar electron beam onto a semiconductor wafer. An electron (hereafter referred to as a mirror electron) bounces and returns near the surface of a circuit pattern on the semiconductor wafer where a voltage is applied. The system uses a lens to image that mirror electron and generates a pickup image (hereafter referred to as a mirror image) for observation. An abnormal electric characteristic location on the circuit pattern is charged differently from a normal electric characteristic location. A mirror electron returning near the abnormal electric characteristic location is imaged with an orbital different from the one for a mirror electron returning near a normal electric characteristic location. Therefore, observing the mirror image makes it possible to detect an abnormal electric characteristic location.

The AFM (Atomic Force Microscopy) for measuring a heightwise shape of a circuit pattern is one of technologies for measuring circuit pattern states. The AFM scans a specimen surface using a fine needle with a tip curvature of sub-micrometers. The AFM images a heightwise travel distance of the needle in synchronization with the scanning to measure the specimen's heightwise shape.

The AFM can detect heightwise variations of a specimen. However, the AFM's measurement accuracy largely depends on the needle's scanning speed. Increasing the scanning speed degrades the accuracy. It takes a long time to accurately detect heightwise variations of a specimen over a wide range.

SUMMARY OF THE INVENTION

The present invention has been made in consideration of the foregoing. It is therefore an object of the present invention to detect heightwise variations of a specimen.

To address the above-mentioned problem, the invention performs a charge control process as needed so as to equalize a specimen's charge state. The invention uses a mirror projection technique and allows a lens to image a mirror electron bouncing and returning near the surface of the specimen having a uniform charge state to observe a mirror image.

One aspect of the invention is directed to an inspection system for inspecting a heightwise variation in a sample. The system includes: holding means for holding a sample; charging means for charging a sample held by the holding means; voltage application means for applying a voltage to a sample held by the holding means; an electro-optic system that radiates an electron beam to a sample applied with a voltage by the voltage application means and images a mirror electron returning near a sample surface; and image processing means for processing a mirror image acquired by imaging the mirror electron. The image processing means outputs information corresponding to a difference between mirror images, i.e., a mirror image acquired by imaging the mirror electron and a mirror image for a prepared standard preparation, as a heightwise variation in a sample.

According to the aspect of the invention, when a specimen surface contains elevation differences, mirror electrons returning near different heights depict different orbitals and are imaged at different focal positions corresponding to the elevation differences. Observing a resulting mirror image can detect an elevation difference. It is possible to detect a heightwise variation in the specimen by comparing an elevation difference represented by the mirror image for a prepared standard preparation with an elevation difference represented by the specimen's mirror image.

BRIEF DESCRIPTION OF THE DRAWINGS

FIG. 2 schematically diagrams a mirror projection inspection system according to a first embodiment of the invention;

FIG. 5 exemplifies a recipe creation GUI screen displayed on a console terminal 28 during the inspection recipe creation process in FIG. 3, in which

FIG. 9 exemplifies an inspection result GUI screen displayed on a console terminal 28 during the height variation inspection process in FIG. 6, in which

FIG. 18 exemplifies data management GUI screens displayed on the console terminal 28 during data management of inspection results, in which

DETAILED DESCRIPTION OF THE PREFERRED EMBODIMENTS

Principle

Prior to the description of embodiments of the invention, the following describes the principle of detecting elevation differences of a specimen using the mirror projection technique.

Figure 1A:
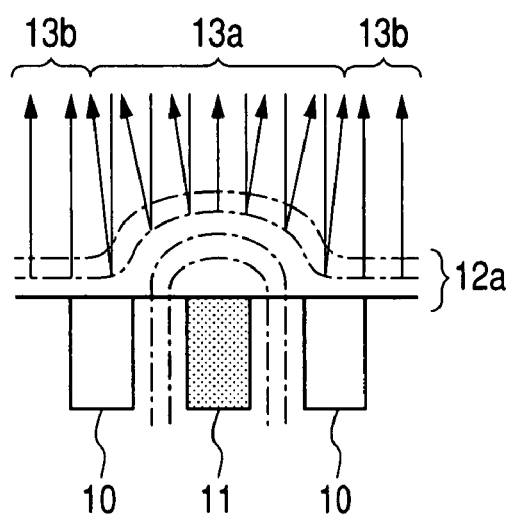
FIGS. 1A and 1B schematically show mirror electron trajectories near a circuit pattern on a semiconductor wafer.
Figure 1B:
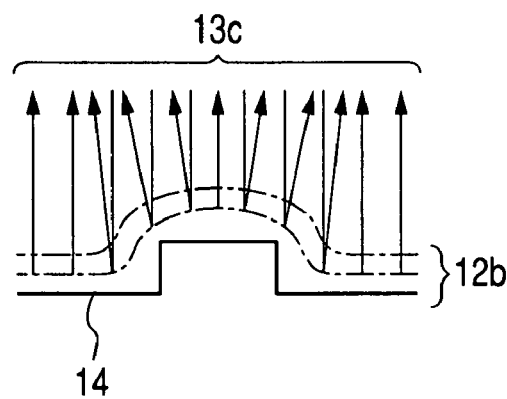

FIGS. 1A and 1B schematically show mirror electron trajectories near a circuit pattern on a semiconductor wafer. FIG. 1A shows mirror electron trajectories near an electric characteristic failure occurring during a contact process for semiconductor wafer manufacturing on a circuit pattern. FIG. 1B shows mirror electron trajectories near a circuit pattern having an elevation difference.

As shown in FIG. 1A, for example, a normal electric characteristic portion 10 on the circuit pattern is charged to 0 V, and an abnormal electric characteristic portion 11 is charged to −1 V. In this case, an equipotential surface 12a curves near the abnormal electric characteristic portion 11. As a result, a mirror electron 13a bouncing near the abnormal electric characteristic portion 11 generates a trajectory different from the one generated by a mirror electron 13b bouncing near the normal electric characteristic portion 10. The former trajectory is imaged at a focal position heightwise different from the one for the mirror electron 13b.

Similarly, as shown in FIG. 1B, an equipotential surface 12b curves in accordance with an elevation difference 14 on the circuit pattern. Mirror electrons 13c generate different trajectories in accordance with the elevation difference 14 on the circuit pattern. The trajectories are imaged at heightwise different focal positions.

The invention charges a specimen as needed so that the circuit pattern is provided with a uniform charge state (so that the same charge state is applied to the normal electric characteristic portion and the abnormal electric characteristic portion). The mirror projection technique is then used for observing a mirror image of the specimen to detect the specimen's elevation difference.

First Embodiment

FIG. 2 schematically diagrams a mirror projection inspection system according to a first embodiment of the invention.

As shown in FIG. 2, a mirror projection inspection system 2 according to the embodiment includes: an electro-optic system 20; a sample chamber 21 where a sample (semiconductor wafer) 29 is placed; a charge control unit 23; a stage control unit 24; an electro-optic system control unit 25; a system control unit 26; an image processing unit 27; and a console terminal 28 for accepting an instruction from an operator or displaying information for an operator.

The electro-optic system 20 includes a radiation optics system 201, an imaging optics system 202, and a projection optics system 203. An evacuator (not shown) always places the electro-optic system 20 in an evacuated atmosphere.

The radiation optics system 201 includes a cathode 2011, a condenser lens 2012, and a diaphragm 2013. The imaging optics system 202 includes a beam separater 2021, and an objective lens 2022. The projection optics system 203 includes an intermediate lens 2031, a projection lens 2032, and a detector 2033.

When the cathode 2011 generates an electron beam, the condenser lens 2012 condenses it. The diaphragm 2013 limits an orbital of the electron beam so as to provide an intended radiation region. The electron beam is then focused on a focal plane of the objective lens 2022 positioned near the beam separater 2021. The focal plane of the objective lens 2022 depends on excitation of the objective lens 2022 and an electrostatic lens effect due to retarding to be described later. When focused on the focal plane, the electron beam is deflected by the beam separater 2021, passes through the objective lens 2022, and becomes a planar electron beam that is radiated perpendicularly to the surface of a sample 29.

A retarding power supply 242 (to be described) of the stage control unit 24 supplies the sample 29 with an electric potential slightly higher than an acceleration voltage of the electron beam. An electric field is formed near the surface of the sample 29 and reflects a circuit pattern shape and a charge state formed on the surface of the sample 29. The electric field functions as deceleration means. Most of the electron beam returns before colliding against the sample 29. The electron beam changes to a mirror electron that moves in a direction and with a strength both corresponding to the circuit pattern shape and the charge state of the sample 29.

The mirror electron is converged by the objective lens 2022 and is deflected by the beam separater 2021 so as to be aligned with an optical axis of the projection optics system 203. The intermediate lens 2031 and the projection lens 2032 form an image on the detector 2033 so as to represent a local charge state change on the surface of the sample 29 and an elevation difference. It is preferable that the cathode 2011 narrows the energy width of an emission electron. The energy of an electron entering the sample 29 determines on which equipotential surface of the electric field formed on the sample 29 the electron returns. The presence of the emission electron's energy width images the mirror electron returning from a different equipotential surface. This degrades the image resolution. The detector 2033 uses a TDI (Time Delay Integration) sensor or a CCD (Charge Coupled Devices), for example. The detector 2033 fast detects an image formed on the detection plane, converts the image into an electric signal corresponding to the mirror electron quantity, and transmits the signal to the image processing unit 27.

The sample chamber 21 includes: a holder 211 for mounting the sample 29; a stage 212 for moving the sample 29 perpendicularly to an incident direction of the electron beam; a stage driving device 244 such as a motor; and an optical microscope 213.

The holder 211 is electrically insulated from the stage 212 so as to be able to apply a retarding voltage to the holder 211 and the sample 29 mounted on the holder 211. The retarding voltage is applied to the holder 211 via a high-voltage feedthrough (not shown). The retarding voltage is output from the retarding power supply 242 disposed outside the sample chamber 21 (i.e., the stage control unit 24). Similarly to the electro-optic system 20, an evacuator (not shown) always evacuates the sample chamber 21 inside.

The optical microscope 213 is used for finding an intended location in the sample 29 mounted on the holder 211 or creating an inspection recipe.

The charge control unit 23 measures a charge state of the sample 29 mounted on the holder 211 and charges the sample 29 so as to equalize the charge state. A charge process is performed by applying an electric potential to a charge control electrode 231 disposed near the sample 29. The sample's charge state is found by measuring the value of an electric current flowing through the charge control electrode 231. This process can eliminate only an electric field resulting from a nonuniform charge state from electric fields generated by another apparatus or the like on the surface of the sample 29. In this manner, a height variation inspection process (to be described) can detect only electric field distortion due to an elevation difference on the surface of the sample 29. A surface electrometer may be used to measure the charge state of the sample 29.

The stage control unit 24 includes a main control device 241, a retarding power supply 242, and a stage position measuring device 243.

The main control device 241 receives a control signal about stage movement from the system control unit 26. Based on the received control signal, the main control device 241 controls the stage driving device 244 to move the stage 212 in accordance with a position of the stage 212 measured by the stage position measuring device 243. As a result, the holder 211 mounted on the stage 212 moves perpendicularly to the electron beam's incident angle, making it possible to capture a mirror image for an intended region of the sample 29 mounted on the holder 211. The stage position measuring device 243 measures positions of the stage 212, the charge control unit 23, the optical microscope 213, and the electro-optic system 20. The main control device 241 transfers these positions to the system control unit 26. The system control unit 26 generates a control signal for moving the stage 212 and transmits it to the main control device 241 based on positions of the stage 212, the charge control unit 23, the optical microscope 213, and the electro-optic system 20. The control signal is used for moving the stage 212 so that an intended region of the sample 29 mounted on the holder 211 is positioned directly under any of the charge control unit 23, the optical microscope 213, and the electro-optic system 20. In this manner, the main control device 241 can move the stage 212 so that an intended region of the sample 29 mounted on the holder 211 is positioned directly under any of the charge control unit 23, the optical microscope 213, and the electro-optic system 20.

The electro-optic system control unit 25 includes a main control device 251, a radiation optics system control device 252, and a projection optics system control device 253.

The main control device 251 receives a control signal concerning the electron beam radiation from the system control unit 26. Based on the received control signal, the main control device 251 allows the radiation optics system control device 252 to control parts of the radiation optics system 201 and the imaging optics system 202 such as the cathode 2011, the lenses 2012 and 2022, the beam separater 2021, an astigmatic compensator, and a deflector (both not shown). The main control device 251 allows an electron beam to be radiated to the sample 29 so as to image the mirror electron 5 at an intended contrast. In addition, the main control device 251 controls the retarding power supply 242 of the stage control unit 24. The main control device 251 also receives a control signal concerning the mirror image capturing from the system control unit 26. Based on the received control signal, the main control device 251 allows the projection optics system control device 253 to control parts of the projection optics system 203 such as the lenses 2031 and 2032 and the detector 2033 and detect a mirror electron returning near the sample 29.

The image processing unit 27 includes an image formation device 271 and an image processing device 272.

The image formation device 271 incorporates a signal corresponding to the intensity of the mirror electron detected by the detector 2033 of the projection optics system 203. The signal is incorporated in synchronization with a coordinate signal for the stage 212 transmitted from the main control device 241 of the stage control unit 24. The image formation device 271 AD-converts the incorporated signal and transmits the signal to the image processing device 272. The image processing device 272 performs an image process of extracting a heightwise variation from the mirror image represented by the signal received from the image formation device 271. The image processing device 272 transmits the result together with the mirror image as needed to the system control unit 26.

The system control unit 26 follows a user instruction accepted from the console terminal 28, generates a control signal for moving the stage 212, and transmits the control signal to the stage control unit 24. The system control unit 26 allows the charge control unit 23 to charge the sample 29 so as to equalize the charge state of the sample 29 mounted on the holder 211. The system control unit 26 provides an operator with a detection result of the height variation received from the image processing unit 27 or a detection result of the mirror image and the height variation by displaying the result on a display screen of the console terminal 28.

In the mirror projection inspection system according to the above-mentioned construction, the charge control unit 23, the stage control unit 24, and the electro-optic system control unit 25 may be implemented as hardware using integrated logic ICs such as ASIC (Application Specific Integrated Circuits) and FPGA (Field Programmable Gate Array). The units may be implemented as software using a computer such as DSP (Digital Signal Processor). The system control unit 26, the image processing unit 27, and the console terminal 28 can be implemented on a general computer containing a CPU, memory, an external storage such as an HDD, a reader for reading information from a portable storage medium 409 such as CD-ROM or DVD-ROM, an input device such as a keyboard or a mouse, an output device such as a display, a communication device for communication with a destination device via a communication line, and a bus for connecting these devices with each other. In this case, the CPU executes a specified program loaded into the memory.

The following describes operations of the mirror projection inspection system according to the above-mentioned construction. Operations of the mirror projection inspection system according to the above-mentioned construction can be categorized into two processes. One is a process for creating an inspection recipe containing information (alignment information about the electro-optic system 20, charge control information about the charge control device 23, and elevation difference information about the sample 29 as a reference for the height variation detection) needed to inspect a height variation of the sample 29. The other is a process for detecting a height variation of the sample 29 using the inspection recipe.

Figure 3:
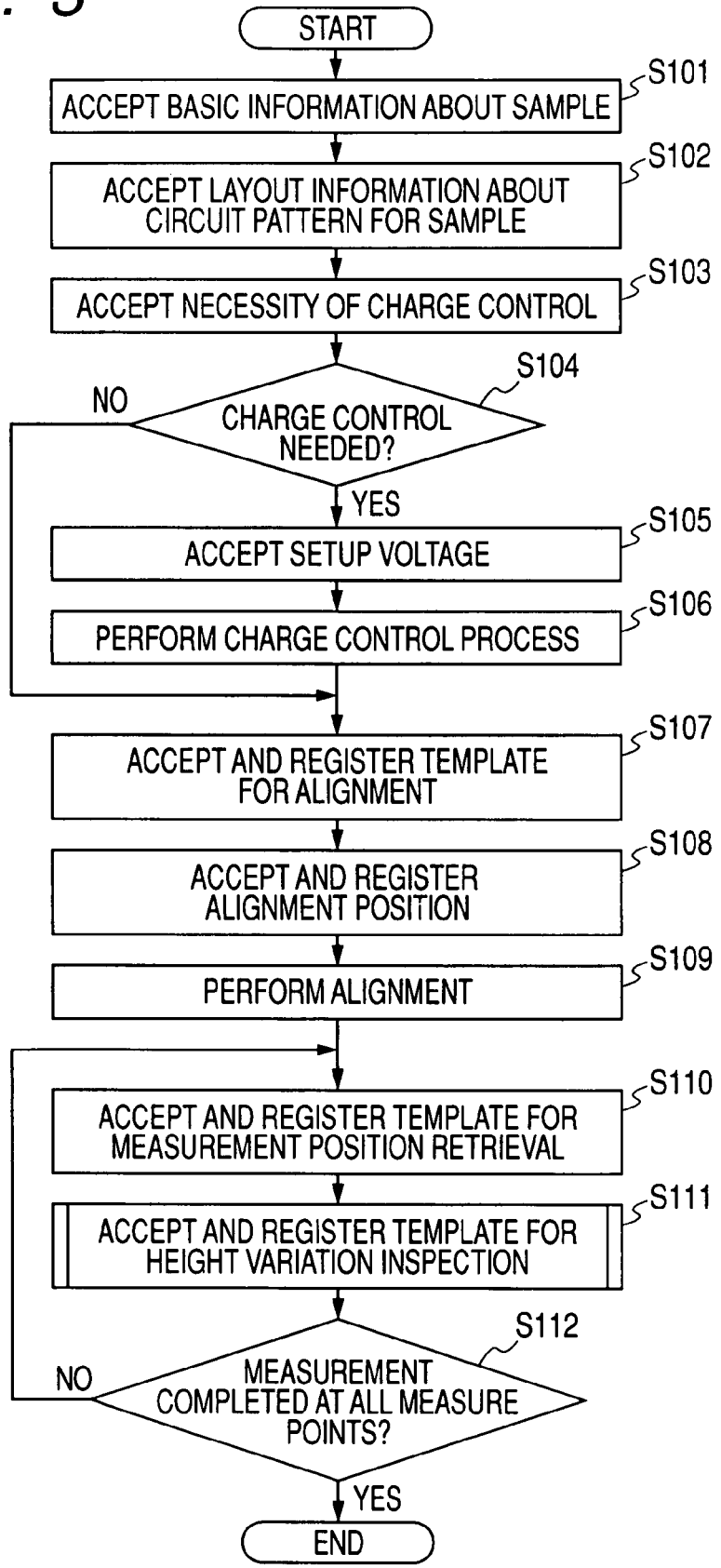
FIG. 3 shows a flowchart for explaining an inspection recipe creation process of the mirror projection inspection system according to the first embodiment of the invention.

FIG. 3 shows a flowchart for explaining an inspection recipe creation process of the mirror projection inspection system according to the first embodiment of the invention.

When an operator uses the console terminal 28 to input basic information about the sample 29 to be measured, the system control unit 26 accepts the input basic information (S101). When the sample 29 is a semiconductor wafer, the basic information contains the semiconductor wafer brand, the manufacturing process name, and the like. The system control unit 26 stores the basic information in memory or the like for managing an inspection recipe to be created.

When the operator uses the console terminal 28 to input layout information about a circuit pattern of the sample 29 to be measured, the system control unit 26 accepts the input information and registers it in the memory correspondingly to the basic information about the sample 29 accepted at Step S101 (Step S102). The operator may input the circuit pattern layout information into the console terminal 28 by confirming an optical image resulting from the optical microscope 213. Alternatively, the operator may create the circuit pattern layout information based on dimensions described in CAD data of the sample 29 and input the information into the console terminal 28.

The system control unit 26 accepts the operator-specified necessity of the charge control process for the sample 29 to be measured (Step S103). The operator specifies the necessity of the charge control process using the console terminal 28. Further, it is possible to automatically configure the necessity of the charge control process in accordance with the basic information about the sample 29 accepted at Step S101. There are two types of automatic configuration methods. One is to reference an inspection recipe for the existing sample 29 that is stored in the memory and has the same basic information. When the charge control process is needed according to the description of the inspection recipe, the charge control is assumed to be needed for the current operation. The other method is to use the memory to store correlation table data indicating the necessity of the charge control process for each basic information about the sample. The method uses the correlation table data to determine whether or not the charge control process is needed. When the sample 29 is a semiconductor wafer, for example, the process name reflects the wafer surface structure and the material. The method creates correlation table data indicating the necessity of the charge control process for each process name and stores the correlation table data in the memory. The system control unit 26 references the correlation table data and performs the determination in accordance with the necessity of the charge control process associated with the same name as the basic information.

When the charge control process is unneeded (NO at Step S104), the system control unit 26 proceeds to Step S107. When the charge control process is needed (YES at Step S104), the system control unit 26 accepts input of a setup voltage used for the charge control process from the operator via the console terminal 28. The system control unit 26 registers the setup voltage in the memory correspondingly to the basic information about the sample 29 accepted at Step S101 (Step S105), and then proceeds to Step S106. The setup voltage is determined so as to equalize the charge state throughout the entire sample 29. That is, the setup voltage is determined so as not to irregularly charge the circuit pattern and not to generate a pattern-dependent charging contrast detrimental to the height variation measurement. The mirror projection inspection system disables an electron from entering a circuit pattern during imaging and can use an electricity removal process to equalize the charge state of a major part of the sample 29.

At Step S105, the system control unit 26 registers the setup voltage correspondingly to the basic information about the sample 29. At Step S106, the system control unit 26 applies that setup voltage to a standard preparation (a sample used as a standard for the height variation determination) for the sample 29 mounted on the holder 211. In this manner, the system control unit 26 performs the charge control process for the standard preparation for the sample 29. The system control unit 26 then proceeds to Step S107.

At Step S107, the system control unit 26 registers an alignment template used for an alignment process. The alignment process adjusts positional relationship between the coordinate of the stage 212 and the coordinate of the circuit pattern of the sample 29 mounted on the holder 211. The embodiment performs rough alignment (first alignment process) using an optical image and then performs fine alignment (second alignment process) using a mirror image. The system control unit 26 follows an instruction accepted from an operator via the console terminal 28 to acquire a previously captured optical image for the standard preparation for the sample 29. The system control unit 26 registers this optical image as a first alignment template in the memory correspondingly to the basic information about the sample 29 accepted at Step S101. Similarly, the system control unit 26 acquires a previously captured mirror image for the standard preparation for the sample 29. The system control unit 26 registers this mirror image as a second alignment template in the memory correspondingly to the basic information about the sample 29 accepted at Step S101.

The system control unit 26 follows an instruction accepted from the operator via the console terminal 28 and controls the stage control unit 24 to move the stage 212. The system control unit 26 registers position coordinates for aligning the sample 29 (first and second alignments) to the memory correspondingly to the basic information about the sample 29 accepted at Step S101 (Step S108). The alignment needs to be performed for at least two locations so as to accurately adjust the positional relationship between the coordinate of the stage 212 and the coordinate of the sample 29 (circuit pattern) mounted on the holder 211. At Step S107, the embodiment registers two templates (optical image and mirror image) for the first and second alignments. At Step S108, the embodiment registers at least two different coordinates on the sample 29 for acquiring images used for alignments. The two coordinates are registered for each of the first and second alignments. Obviously, the position coordinates for acquiring images for the first and second alignments need to differ from the position coordinates for acquiring the template images.

The system control unit 26 controls the stage control unit 24 to move the stage 212 to the two position coordinates registered at Step S108. The optical microscope 213 and the detector 2033 are used to capture images for the alignments. The system control unit 26 performs the alignment by comparing the acquired images (optical image and mirror image) with the alignment templates registered at Step S107 correspondingly to the basic information about the sample 29 (Step S109). An alignment image may be acquired at Step S108 for registering the position coordinate. In this case, the system control unit 26 stores the acquired image in the memory correspondingly to an alignment image index and recalls the image at Step S109 to perform the alignment.

Specifically, the system control unit 26 first performs the first alignment process. The system control unit 26 follows an instruction accepted from the operator via the console terminal 28 to select one of the first alignment templates registered at Step S107 and select any of two (or more) optical images captured at Step S109. The system control unit 26 displays the selected first alignment template and the optical image on the console terminal 28. The operator compares the first alignment template with the optical image displayed on the console terminal 28 and observes a displacement between both (e.g., a displacement between feature points such as edges on the circuit pattern). The operator performs this process for all optical images acquired at Step S109 and for all the first alignment templates. The operator inputs a resulting displacement amount to the console terminal 28. The system control unit 26 accepts the displacement amount from the operator via the console terminal 28 and registers the displacement amount to the system control unit 26 correspondingly to the basic information about the sample 29 accepted at Step S101. The registered displacement amount is used as a first alignment amount (offset) for aligning the coordinate of the stage 212 to the circuit pattern coordinate of the sample 29.

The system control unit 26 then performs the second alignment process. The system control unit 26 follows an instruction accepted from the operator via the console terminal 28 to select one of the second alignment templates registered at Step S107 and select any of two (or more) mirror images captured at Step S109. The system control unit 26 displays the selected second alignment template and the mirror image on the console terminal 28. The system control unit 26 displays the mirror image by reflecting the first alignment amount on the circuit pattern coordinate of the sample 29. The operator compares the second alignment template with the mirror image displayed on the console terminal 28 and observes a displacement between both (e.g., a displacement between feature points such as edges on the circuit pattern). The operator performs this process for all optical images acquired at Step S109 and for all the second alignment templates. The operator inputs a resulting displacement amount to the console terminal 28. The system control unit 26 accepts the displacement amount from the operator via the console terminal 28 and registers the displacement amount to the system control unit 26 correspondingly to the basic information about the sample 29 accepted at Step S101. The registered displacement amount is used as a second alignment amount (offset) for aligning the coordinate of the stage 212 to the circuit pattern coordinate of the sample 29.

After completion of the above-mentioned alignment, the system control unit 26 registers a measurement position retrieval template used for retrieving a measurement location for the circuit pattern of the sample 29 (Step S110). According to the embodiment, the measurement position retrieval template contains a mirror image of the measurement location previously captured at a low magnification and the coordinate of the stage 212 at the measurement location accepted from the operator via the console terminal 28. The system control unit 26 registers the measurement position retrieval template in the memory correspondingly to the basic information about the sample 29 accepted at S101. The low magnification for the wafer inspection system signifies a magnification capable of identifying a location of a repetition unit such as an exposed shot, a die, or a memory mat for the circuit pattern formed on the wafer. A present semiconductor wafer uses a circuit pattern repetition unit sized to approximately 50 through 200 µm equivalent to 500× through 2000× magnification for an acquired image.

The system control unit 26 then registers a height variation inspection template for inspecting a height variation at the measurement location of the circuit pattern formed on the sample 29 (Step S111). Specifically, the system control unit 26 corrects the coordinate of the stage 212 using the first and second alignment amounts registered correspondingly to the basic information about the sample 29. The system control unit 26 controls the stage control unit 24 using the corrected coordinate of the stage 212. The system control unit 26 moves the stage 212 to the measurement location in any of the measurement position retrieval templates registered correspondingly to the basic information about the sample 29 accepted at S110. The system control unit 26 controls the electro-optic system control unit 25 and allows the electro-optic system 20 to capture a low-magnification mirror image. The system control unit 26 performs pattern matching between the captured mirror image and the template's mirror image to determine a coordinate of the stage 212 at the measurement location. The system control unit 26 controls the electro-optic system control unit 25 to capture a mirror image at the measurement location specified by the determined coordinate. It is assumed that this mirror image is captured at approximately the same magnification as that of the mirror image used for inspecting a height variation. The system control unit 26 creates a height variation inspection template at the measurement location from the captured mirror image and registers the template to the memory correspondingly to the basic information about the sample 29. A process for creating the height variation inspection template will be described later in detail.

The system control unit 26 inquires of the operator through the console terminal 28 whether or not to continue registering a height variation inspection template. When the registration continues (NO at Step S112), control returns to Step S110. When the registration does not continue (YES at Step S112), the process flow terminates. This signifies that height variation inspection templates have been registered for all the measurement locations.

In this manner, the inspection recipe information about the sample 29 is registered to the memory correspondingly to the basic information about the sample 29.

The following describes the process of creating the height variation inspection template (Step S111 in FIG. 3). The height variation inspection template creation process includes a filter pattern creation process and a reference pattern creation process. The filter patter creation process creates a filter pattern for filtering information about an elevation difference from the mirror image for the standard preparation for the sample 29. The reference pattern creation process creates a reference pattern to be compared with the mirror image for the sample 29 from the mirror image for the standard preparation for the sample 29. The following describes the filter pattern creation process and the reference pattern creation process independently.

The filter pattern creation process will be described first.

Figure 4:
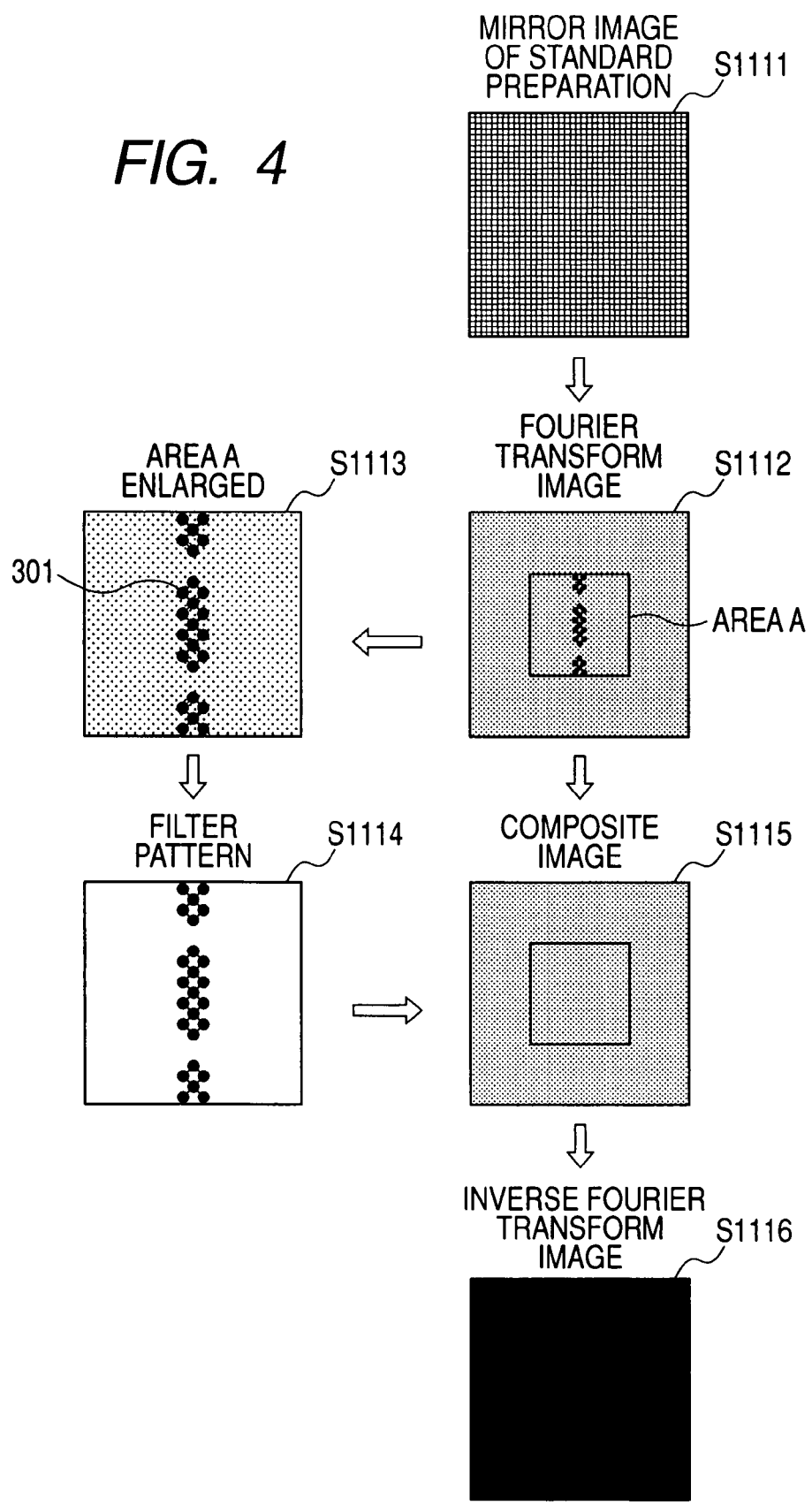
FIG. 4 shows a flow diagram for illustrating a filter pattern creation process.

FIG. 4 shows a flow diagram for illustrating a filter pattern creation process.

The image processing unit 27 incorporates a signal corresponding to the intensity of a mirror electron detected by the detector 2033 of the projection optics system 203. The signal is incorporated in synchronization with a coordinate signal for the stage 212 transmitted from the main control device 241 of the stage control unit 24. The image processing unit 27 AD-converts the incorporated signal to generate a mirror image (Step S1111). The standard preparation for the sample 29 preferably contains as small a height variation as possible. Acquiring a mirror image using the sample 29 containing a large height variation degrades characteristics of a filter pattern as the reference and degrades the accuracy of measuring a height variation at a later stage.

The image processing unit 27 selects a highly periodic region (trimming window) sized to 2n×2n pixels from the mirror image. The image processing unit 27 performs a Fourier transform (fast Fourier transform) to generate a Fourier transform image (Step S1112). The image processing unit 27 transmits the generated Fourier transform image to the system control unit 26. The system control unit 26 receives the Fourier transform image from the image processing unit 27 and displays the image on the console terminal 28.

The system control unit 26 accepts a filter pattern created based on the Fourier transform image from the operator via the console terminal 28. The operator magnifies the Fourier transform image displayed on the console terminal 28 as needed and confirms a spot 301 resulting from the periodicity of the original mirror image (Step S1113). The operator selects one spot by one using a pointing device such as a mouse. The console terminal 28 generates a filter pattern for masking each spot selected by the operator (Step S1114) and transmits the filter pattern to the system control unit 26. Too large a mask may eliminate the height variation information during an inverse Fourier transform to be described later. For this reason, it is preferable to provide the console terminal 28 with multiple mask sizes for hiding a spot. It is a good practice to use a small mask for finely measuring a minute height variation and use a large mask for extracting only an excessive height variation. The inverse Fourier transform is performed by masking all spots that can be confirmed in the Fourier transform image. In this manner, it is possible to remove a periodic component of an elevation difference attributed to the standard preparation for the sample 29 (a periodic component of the height originally attributed to the circuit pattern under inspection).

The system control unit 26 accepts the filter pattern from the console terminal 28 and transmits it to the image processing unit 27. The image processing unit 27 receives the filter pattern from the system control unit 26 and synthesizes it with the Fourier transform image to mask the Fourier transform image (Step S1115). The image processing unit 27 performs an inverse Fourier transform on the masked Fourier transform image and transmits the inverse Fourier transform image to the system control unit 26 (Step S1116). The system control unit 26 receives the inverse Fourier transform image from the image processing unit 27 and displays it on the console terminal 28. When it is possible to remove a periodic component of an elevation difference attributed to the standard preparation for the sample 29 (a periodic component of the height originally attributed to the circuit pattern under inspection), the inverse Fourier transform image becomes flat (uniform). The operator evaluates the contrast on the inverse Fourier transform image and determines whether or not to register the filter pattern based on the evaluating result. The operator inputs the determination result to the console terminal 28. When the determination result input to the console terminal 28 indicates registration of the filter pattern, the system control unit 26 registers the filter pattern to the memory correspondingly to the basic information about the sample 29. When the determination result indicates re-creation of a filter pattern, control returns to Step S1114.

The reference pattern creation process will be described.

Reference patterns include a mirror image itself and an inverse Fourier transform image generated by performing an inverse Fourier transform only on a circuit pattern's periodic component contained in the Fourier transform image for the mirror image.

When the reference pattern is a mirror image itself, the image processing unit 27 incorporates a signal corresponding to the intensity of the mirror electron detected by the detector 2033 of the projection optics system 203. The signal is incorporated in synchronization with a coordinate signal for the stage 212 transmitted from the main control device 241 of the stage control unit 24. The image processing unit AD-converts the incorporated signal to generate a mirror image and transmits it to the system control unit 26. The system control unit 26 receives the mirror image from the image processing unit 27 and registers it as the reference pattern to the memory correspondingly to the basic information about the sample 29.

When the reference pattern is an inverse Fourier transform image, the image processing unit 27 performs a Fourier transform on the generated mirror image. The image processing unit 27 filters the Fourier transform image to extract a periodic component from the circuit pattern. The image processing unit 27 performs an inverse Fourier transform on the periodic component extracted from the circuit pattern. The image processing unit 27 transmits the inverse Fourier transform image to the system control unit 26. The system control unit 26 receives the inverse Fourier transform image from the image processing unit 27 and registers it as the reference pattern to the memory correspondingly to the basic information about the sample 29.

Figure 5A:
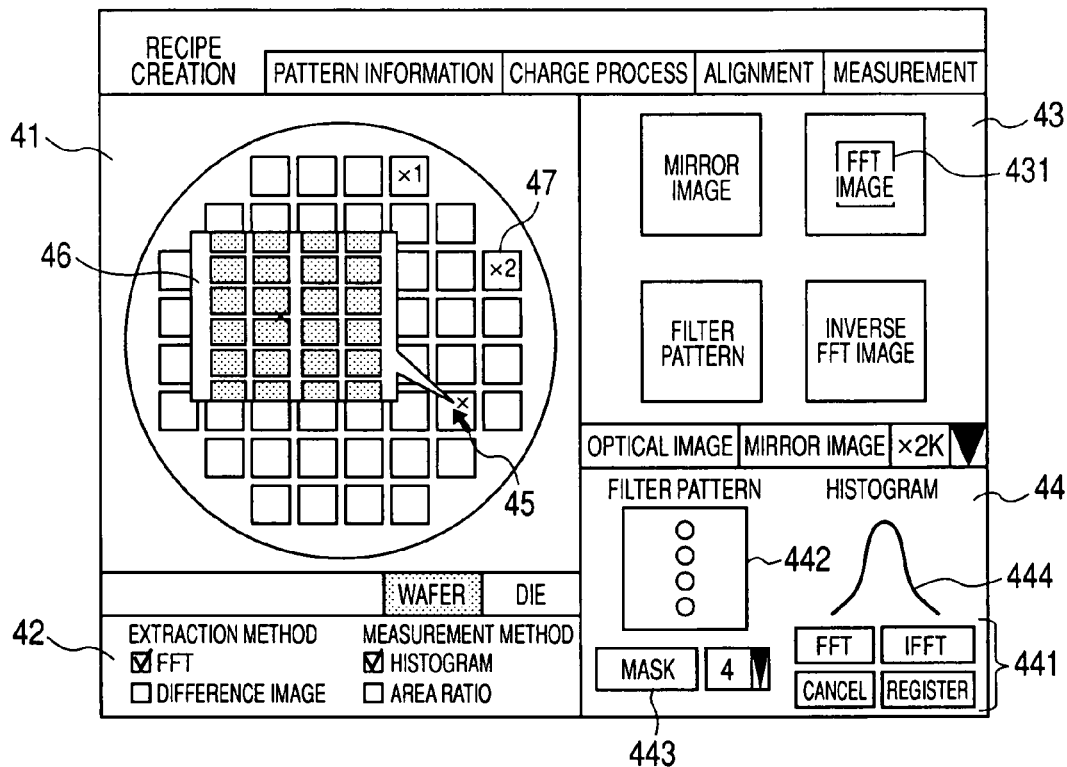
FIG. 5A shows a GUI screen example of registering a filter pattern as a height variation inspection template and FIG. 5B shows a GUI screen example of registering a reference pattern as a height variation inspection template.
Figure 5B:
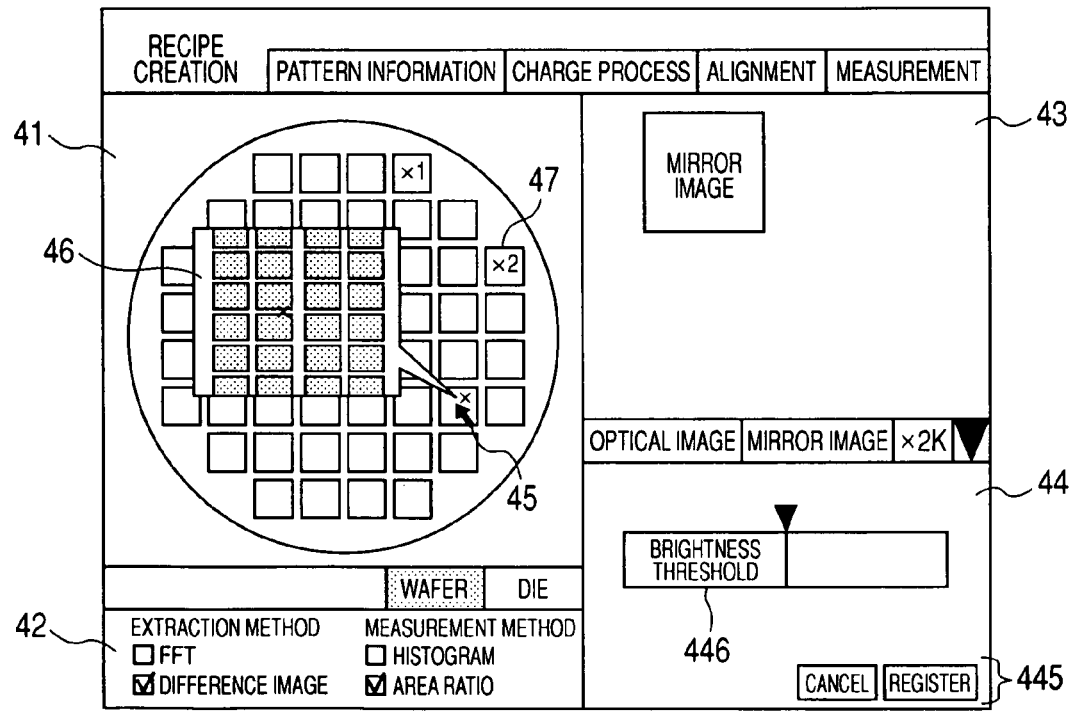

FIG. 5 exemplifies a recipe creation GUI screen displayed on a console terminal 28 during the inspection recipe creation process in FIG. 3. FIG. 5A shows a GUI screen example of registering a filter pattern as a height variation inspection template. FIG. 5B shows a GUI screen example of registering a reference pattern as a height variation inspection template.

As shown in FIGS. 5A and 5B, a GUI screen for registering a height variation inspection template includes: a layout display window 41 for displaying a layout of a circuit pattern formed on the sample 29 (e.g., a semiconductor wafer); an image processing specification pane 42 for specifying the extraction method and the measurement method for height variations; an acquired image display window 43 for displaying various images including a mirror image and a height variation inspection template; and a parameter setup pane 44 for setting an image processing parameter to extract and measure a height variation.

The layout display window 41 is used for specifying a measurement location on the circuit pattern. The operator operates a pointer 45 using the pointing device such as a mouse to specify a measurement location on the circuit pattern. The console terminal 28 then transmits information about the measurement location specified by the pointer 45 to the system control unit 26. The system control unit 26 controls the stage control unit 24, the optical microscope 213, and the image processing unit 27 to acquire image data of the optical image for the measurement location specified by the pointer 45 and transmit the image data to the console terminal 28. The console terminal 28 displays the acquired imaged data of the optical image in a layout display sub-window 46. When acquired image display window 43 displays no mirror image, the console terminal 28 activates the layout display sub-window 46 and realtime updates the optical image. The operator can register a measurement location (measurement region) by specifying an intended region on the optical image using the pointer 45. The operator can change the magnification of an optical image displayed in the layout display sub-window 46 so as to be able to specify intended regions on various patterns from the optical image. The console terminal 28 displays the registered measurement location in the layout display window 41. The measurement location is provided with a marker 47 together with an ID number indicating the registration sequence.

The image processing specification pane 42 contains checkboxes for specifying the extraction method and the measurement method for height variations. According to the embodiment, the height variation extraction method can be selected from the fast Fourier transform method (the above-mentioned filter pattern creation process) and the difference image method (the above-mentioned reference pattern creating process). The height variation measurement method can be selected from the histogram method and the area ratio method. FIG. 5A shows a case of specifying the fast Fourier transform method as the height variation extraction method and the histogram method as the height variation measurement method. FIG. 5B shows a case of specifying the difference image method as the height variation extraction method and the area ratio method as the height variation measurement method. The height variation measurement method will be described later.

The acquired image display window 43 displays an image referenced by the operator when creating a height variation inspection template for the measurement location. When the fast Fourier transform method is specified as the height variation extraction method as shown in FIG. 5A, the acquired image display window 43 displays a mirror image, a Fourier transform image for the mirror image, a trimming window 431 for trimming the Fourier transform image, a filter pattern, and an inverse Fourier transform image resulting from the inverse Fourier transform on the Fourier transform image masked with the filter pattern. When the difference image method is specified as the height variation extraction method as shown in FIG. 5B, the acquired image display window 43 displays only a mirror image (reference pattern), or a mirror image, a Fourier transform image for the mirror image, and an inverse Fourier transform image (reference pattern) resulting from the inverse Fourier transform on a periodic component extracted from the Fourier transform image. The bottom of the acquired image display window 43 contains selection buttons for the optical image and the mirror image. When the selection button is used to select the optical image, the optical image displayed in the layout display sub-window 46 is real-time updated. When the selection button is used to select the mirror image, the mirror image in the acquired image display window 43 is realtime updated.

When the fast Fourier transform method is specified as the height variation extraction method as shown in FIG. 5A, the parameter setup pane 44 contains a specification button 441 for accepting specification of the image process (any one of "FFT", "IFFT", "Cancel", and "Register"), a filter pattern creation window 442 for creating a filter pattern, a specification button 443 for specifying a mask size for the filter pattern displayed in the acquired image display window 43, and a histogram display window 444 for displaying a histogram of the inverse FFT image displayed in the acquired image display window 43. The console terminal 28 enlarges the FFT image in the trimming window 431 displayed in the acquired image display window 43 and displays the FFT image in the filter pattern creation window 442. The operator can move the trimming window 431 to any positions. The operator can stepwise specify the size by pulling down the specification button 443. When the operator uses the pointer 45 to select an intended location in the trimming window 431, the console terminal 28 places a mask at the selected location in the FFT image and adds this mask to the filter pattern creation window 442. When the specification button 441 is used to select IFFT, the console terminal 28 allows the acquired image display window 43 to display the filter pattern in the filter pattern creation window 442 and transmits the filter pattern as well as the IFFT specification to the system control unit 26. The acquired image display window 43 displays the inverse FFT image received from the system control unit 26. The histogram display window 444 displays a histogram of the frequency components. When the specification button 441 is used to select the registration, the console terminal 28 transmits the filter pattern displayed in the filter pattern creation window 442 as a height variation inspection template to the system control unit 26. When the specification button 441 is used to select the cancellation, the console terminal 28 clears the filter pattern and the inverse FFT image displayed in the acquired image display window 43 and clears the contents of the filter pattern creation window 442 and the histogram display window 444.

When the difference image method is specified as the height variation extraction method as shown in FIG. 5B, the parameter setup pane 44 contains a specification button 445 for accepting specification of the image process ("Cancel" or "Register") and a slider 446 for setting a threshold value used to digitize a difference image. When the specification button 445 is used to select the registration, the console terminal 28 transmits the reference pattern displayed in the acquired image display window 43 as a height variation inspection template as well as the digitization threshold value specified by the slider 446 to the system control unit 26. When the specification button 445 is used to select the cancellation, the console terminal 28 clears the mirror image displayed in the acquired image display window 43.

Figure 6:
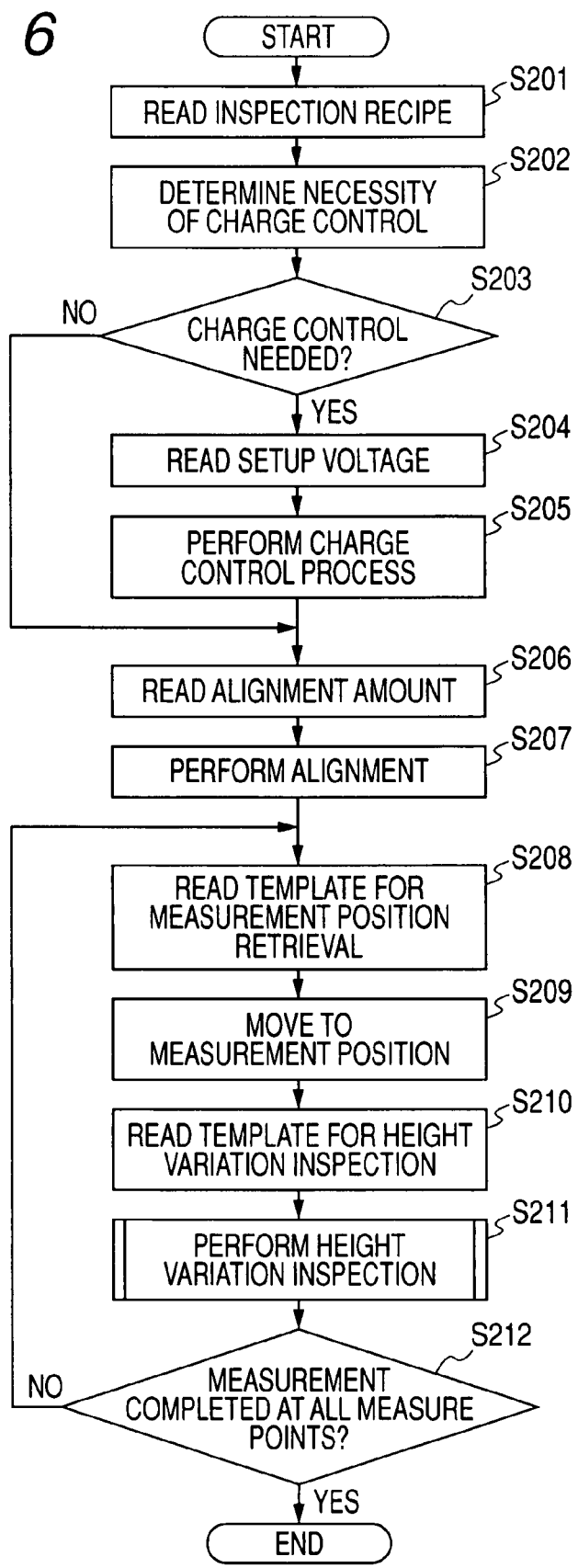
FIG. 6 is a flowchart for explaining a height variation detection process of the mirror projection inspection system according to the first embodiment of the invention.

FIG. 6 is a flowchart for explaining a height variation detection process of the mirror projection inspection system according to the first embodiment of the invention.

When the operator inputs the basic information about the sample 29 to be measured from the console terminal 28, the system control unit 26 accepts the input basic information and reads the inspection recipe that is associated with the basic information and is stored in the memory (Step S201). The system control unit 26 determines whether or not the read inspection recipe contains a setup voltage for the charge control process to determine the necessity of the charge control process (Step S202). When the charge control process is determined to be unneeded (NO at Step S203), control proceeds to Step S206. When the charge control process is determined to be needed (YES at Step S203), the system control unit 26 reads the setup voltage for the charge control process from the inspection recipe (Step S204). The system control unit 26 controls the charge control unit 23 to apply the setup voltage to the sample 29 mounted on the holder 211 and perform the charge control process for the sample 29. The system control unit 26 then proceeds to Step S206.

At Step S206, the system control unit 26 reads the alignment amounts (first and second alignment amounts) from the inspection recipe. Using the alignment amounts, the system control unit 26 corrects the coordinate of the stage 212 for the alignment (Step S207). The alignment here signifies the control of adding an offset to the stage position correspondingly to the alignment amounts stored in the recipe.

After completion of the alignment, the system control unit 26 reads the measurement position retrieval template from the inspection recipe (Step S208). The measurement position retrieval template is used for retrieving a measurement location of the circuit pattern formed on the sample. The system control unit 26 uses the coordinate of the aligned stage 212 and controls the stage control unit 24 to move the stage 212 to the measurement location in the measurement position retrieval template read at Step S208. The system control unit 26 controls the electro-optic system control unit 25 to allow the electro-optic system 20 to capture a low-magnification mirror image. The system control unit 26 performs pattern matching between the captured mirror image and the measurement position retrieval template to determine a coordinate of the stage 212 at the measurement location (Step S209).

The system control unit 26 reads a height variation inspection template from the inspection recipe (Step S210). The height variation inspection template is used for inspecting a height variation at the same measurement location as contained in the measurement position retrieval template read at Step S208. The system control unit 26 controls the electro-optic system control unit 25 to capture a mirror image for the height variation inspection at the measurement location determined at Step S209 (Step S211). The system control unit 26 uses the captured mirror image and the height variation inspection template to inspect a height variation at the measurement location determined at Step S209. The height variation inspection process will be described later.

The system control unit 26 determines whether or not the height variation is inspected using all the measurement position retrieval templates registered to the inspection recipe. When there is a measurement position retrieval template not used for the height variation inspection template (NO at Step S212), the system control unit 26 returns to Step S208 and reads that measurement position retrieval template. When all the measurement position retrieval templates are used for the height variation inspection template (YES at Step S212), the process flow terminates.

In this manner, the height variation for the sample 29 is inspected.

The following describes the height variation inspection process (Step S211 in FIG. 6). The height variation inspection process includes a filter pattern method using the filter pattern as a height variation inspection template and a reference pattern method using the reference pattern as a height variation inspection template. The following describes the filter pattern method and the reference pattern method independently.

Figure 7:
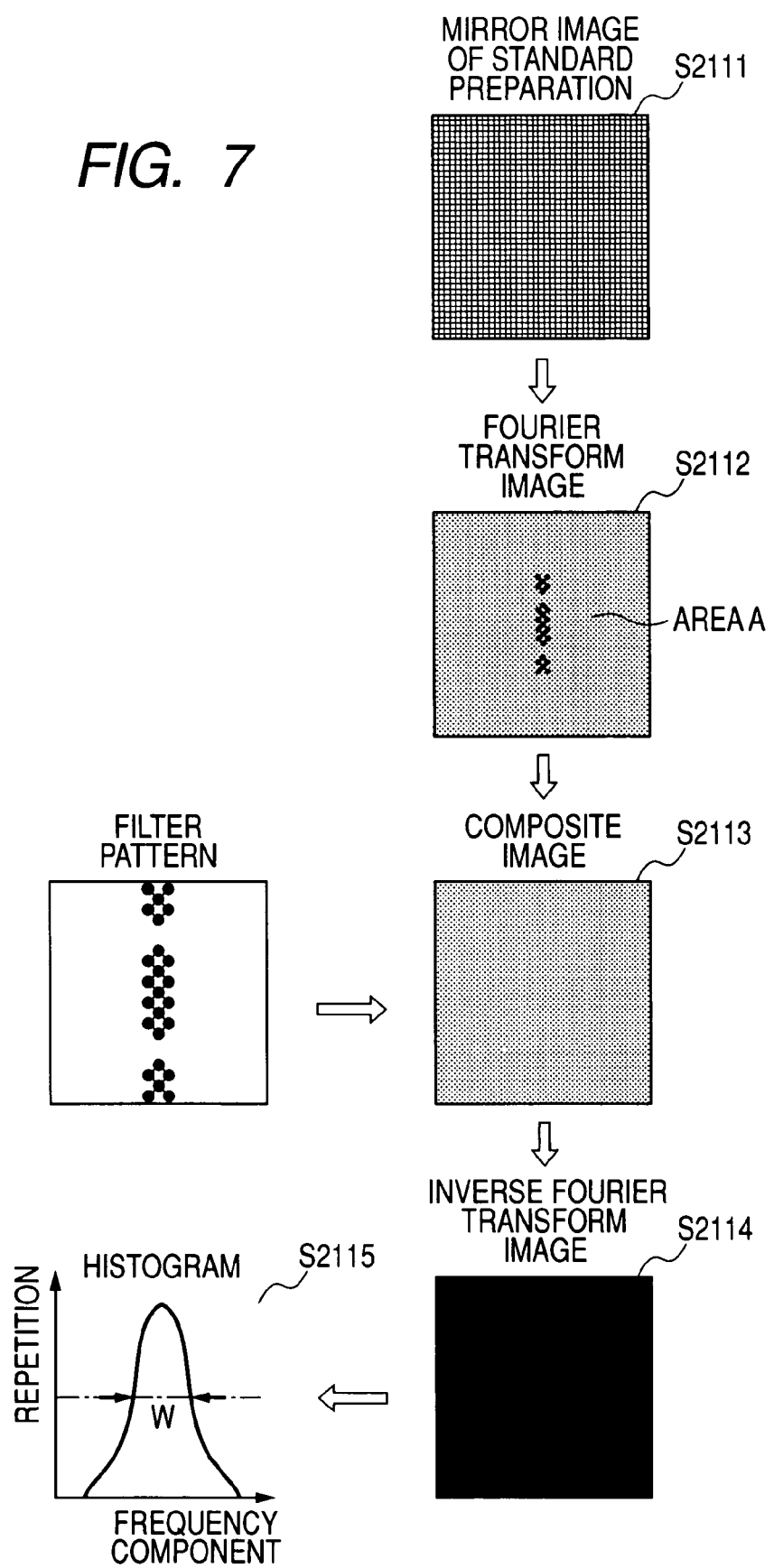
FIG. 7 shows a flow diagram for illustrating a filter pattern method.

FIG. 7 shows a flow diagram for illustrating the filter pattern method.

The image processing unit 27 incorporates a signal corresponding to the intensity of the mirror electron detected by the detector 2033 of the projection optics system 203. The signal is incorporated in synchronization with a coordinate signal for the stage 212 transmitted from the main control device 241 of the stage control unit 24. The image processing unit 27 AD-converts the incorporated signal to generate a mirror image (Step S2111). The image processing unit 27 performs a Fourier transform (fast Fourier transform) on the generated mirror image to generate a Fourier transform image (Step S2112). The image processing unit 27 receives the filter pattern from the system control unit 26 and synthesizes it with the Fourier transform image to mask the Fourier transform image (Step S2113). The image processing unit performs an inverse Fourier transform on the masked Fourier transform image to generate an inverse Fourier transform image (Step S2114). The image processing unit 27 performs a spectrum analysis process on the inverse Fourier transform image to generate histogram distribution data indicating the result (Step S2115). The image processing unit 27 transmits the mirror image, the inverse Fourier transform image, and the histogram distribution data to the system control unit 26. The system control unit 26 receives these pieces of data from the image processing unit 27 and transmits them to the console terminal 28. When the circuit pattern of the sample 29 contains a small height variation against the standard preparation for the sample 29, the inverse Fourier transform image becomes flat (uniform). The width of the histogram distribution data becomes small. When the circuit pattern of the sample 29 contains a large height variation against the standard preparation for the sample 29, the inverse Fourier transform image becomes coarse (nonuniform). The width of the histogram distribution data becomes large. Accordingly, the operator can confirm the degree of a height variation in the sample 29 by confirming the histogram distribution data width that can be represented by a half-value width, i.e., a frequency component width corresponding to a half repetition value. The console terminal 28 may measure a histogram distribution data width and display it as height variation data.

Figure 8:
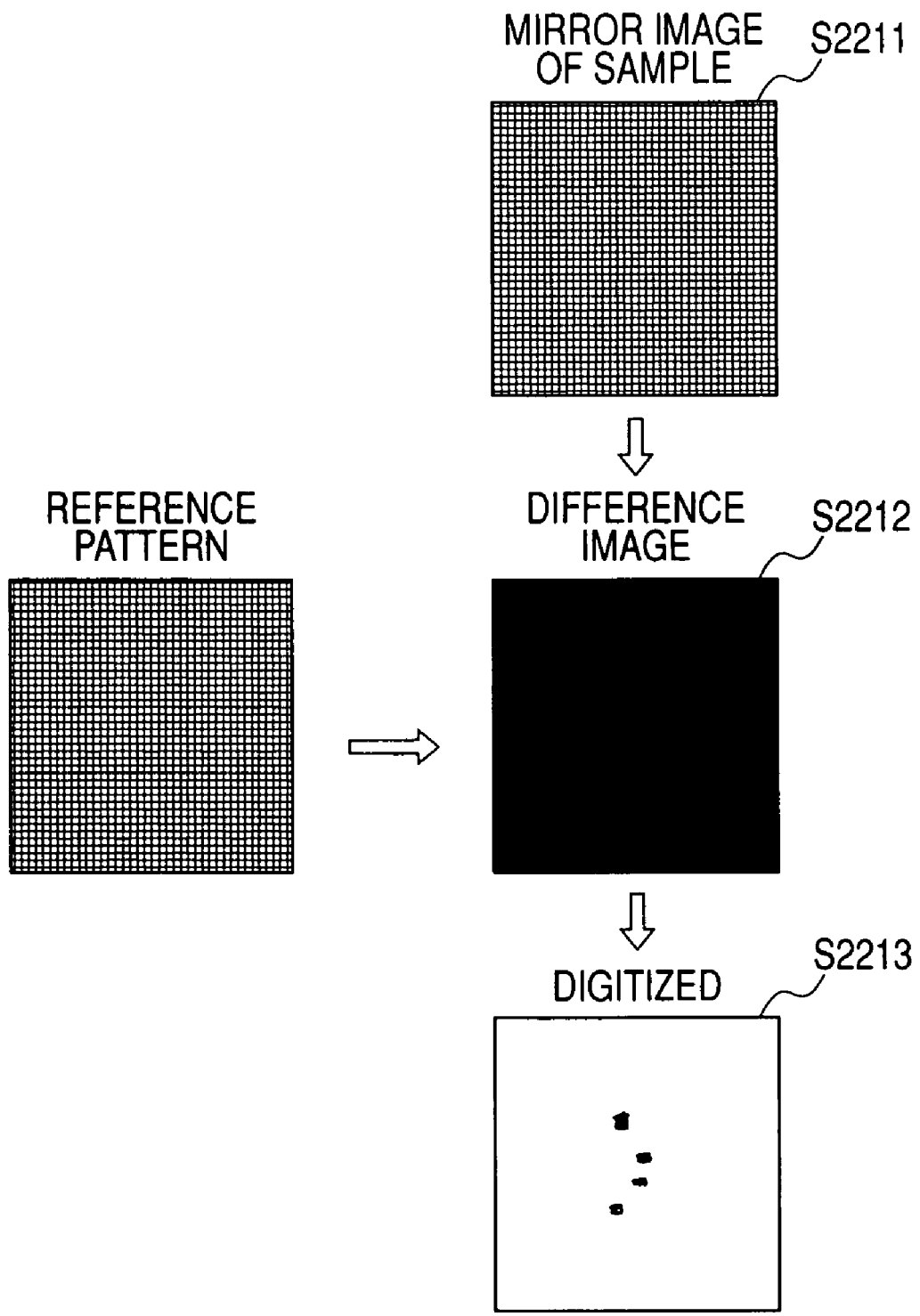
FIG. 8 shows a flow diagram for illustrating a reference pattern method.

FIG. 8 shows a flow diagram for illustrating the reference pattern method.

The image processing unit 27 incorporates a signal corresponding to the intensity of the mirror electron detected by the detector 2033 of the projection optics system 203. The signal is incorporated in synchronization with a coordinate signal for the stage 212 transmitted from the main control device 241 of the stage control unit 24. The image processing unit 27 AD-converts the incorporated signal to generate a mirror image (Step S2211). The image processing unit 27 generates a difference image between the generated mirror image and the reference pattern (mirror image minus reference pattern) (Step S2212). The image processing unit 27 uses a specified threshold value to digitize brightness values for pixels constituting the difference image (Step S2213). The image processing unit 27 transmits the mirror image, the difference image, and the digitized image to the system control unit 26. The system control unit 26 receives these pieces of data from the image processing unit 27 and transmits them to the console terminal 28. When the circuit pattern of the sample 29 contains a small height variation against the standard preparation for the sample 29, the digitized image becomes flat (uniform). The area ratio of a black region to a white region or vice versa becomes small. When the circuit pattern of the sample 29 contains a large height variation against the standard preparation for the sample 29, the digitized image becomes coarse (nonuniform). The area ratio of a black region to a white region or vice versa becomes large. Accordingly, the operator can confirm the degree of a height variation in the sample 29 by confirming the area ratio of a black region to a white region or vice versa in the digitized image. The console terminal 28 may measure the ratio of the number of white pixels to the number of black pixels or vice versa and display the ratio as height variation data.

Figure 9A:
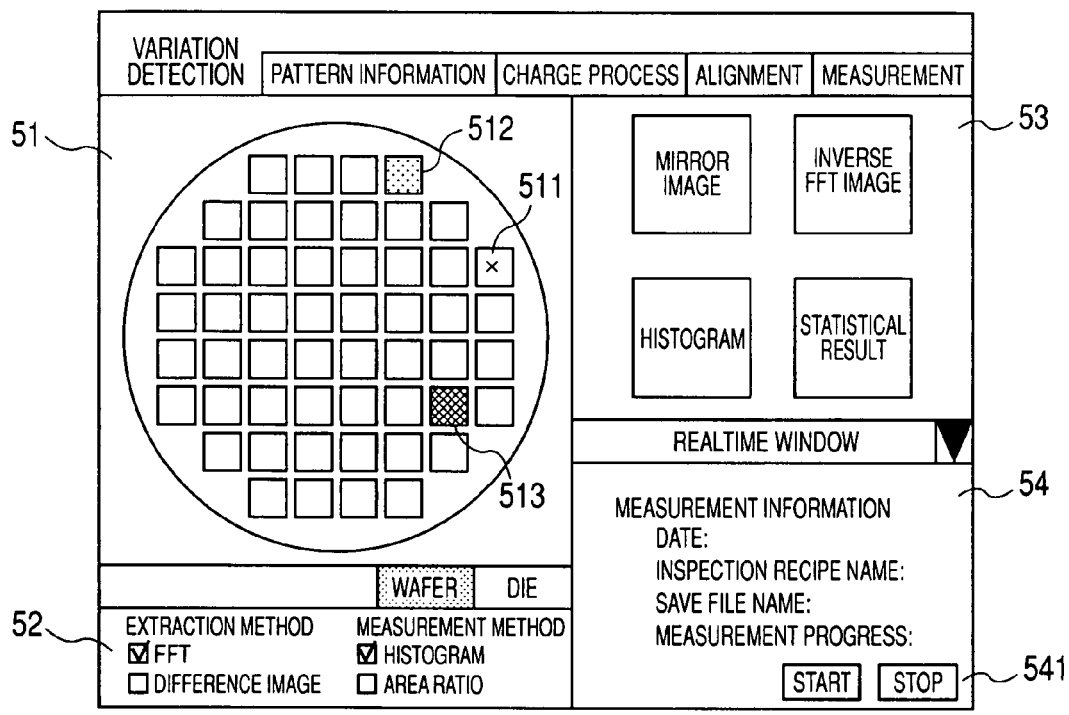
FIG. 9A shows an inspection result GUI screen example according to a filter pattern method and FIG. 9B shows an inspection result GUI screen example according to a filter pattern method.
Figure 9B:
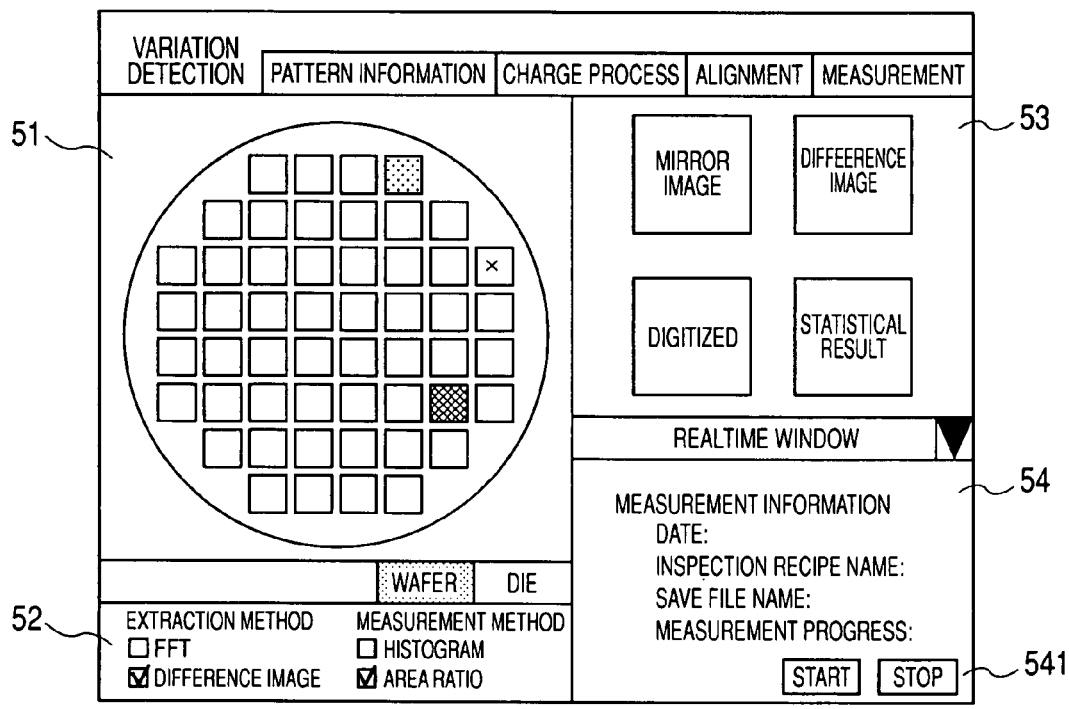

FIG. 9 exemplifies an inspection result GUI screen displayed on the console terminal during the height variation inspection process in FIG. 6. FIG. 9A shows an inspection result GUI screen example according to the filter pattern method. FIG. 9B shows an inspection result GUI screen example according to the filter pattern method.

As shown in FIGS. 9A and 9B, the inspection result GUI screen includes: a layout display window 51 for displaying a circuit pattern layout of the sample 29 (e.g., a semiconductor wafer); an image processing method display pane 52 for displaying the extraction method and the measurement method for height variations as specified in the inspection recipe; a process situation display window 53 for displaying a process situation; and a result display window 54 for displaying a progress.

The layout display window 51 realtime displays which region of the sample 29 is being measured. The system control unit 26 transmits information about the measurement location specified at Step S 209 in FIG. 6 to the console terminal 28. The console terminal 28 displays a marker 511 at the measurement location in the layout display window 51. The following may be preferable. Before starting the inspection, the system control unit 26 transmits all the measurement locations of the sample 29 to the console terminal 28. The console terminal 28 uses all the measurement locations previously received from the system control unit 26 and measurement locations being measured and transmitted realtime to display a measured region 512 and a region to be measured 513 using different colors, for example, so as to be able to distinguish them from each other.

The image processing method display pane 52 displays the extraction method and the measurement method for height variations as specified in the inspection recipe. According to the embodiment, the image processing method display pane 52 displays one of the fast Fourier transform method (the above-mentioned filter pattern method) and the difference image method (the above-mentioned reference pattern method) as the height variation extraction method. The image processing method display pane 52 displays one of the histogram method and the area ration method as the height variation measurement method. FIG. 9A exemplifies a case where the inspection recipe specifies the fast Fourier transform method as the height variation extraction method and the histogram method as the height variation measurement method. FIG. 9B exemplifies a case where the inspection recipe specifies the difference image method as the height variation extraction method and the area ratio method as the height variation measurement method.

The process situation display window 53 displays the image and statistics of the inspection result acquired from the height variation inspection. When the fast Fourier transform method is specified as the height variation extraction method as shown in FIG. 9A, the process situation display window 53 displays a mirror image, an inverse Fourier transform image resulting from the inverse Fourier transform on the mirror image's Fourier transform image masked with the filter pattern, a histogram for the inverse Fourier transform image, and an average value of height variation data (e.g., a half-value width of the histogram) acquired from the histogram for the measured region. When the difference image method is specified as the height variation extraction method as shown in FIG. 9B, the process situation display window 53 displays a mirror image, a difference image between the mirror image and the reference pattern, a digitized image for the difference image, and an average value of height variation data (e.g., the area ratio of a white region to a black region or vice versa) acquired from the digitized image for the difference image.

The result display window 54 displays a measurement date, a file name of the inspection recipe, a file name for saving the inspection result, and a measurement progress. The result display window 54 is provided with a specification button 541 for an operator to start or stop the inspection. The operator can interrupt or restart the measurement at any time using the specification button 541.

There has been described the first embodiment of the invention.

When the circuit pattern of the sample 29 contains elevation differences, mirror electrons returning near different heights depict different orbitals and are imaged at different focal positions corresponding to the elevation differences. Observing a resulting mirror image can detect an elevation difference. The embodiment can detect a heightwise variation in the sample 29 by comparing an elevation difference represented by the previously created pickup image (filter pattern or reference pattern) of the standard preparation with an elevation difference represented by the specimen's pickup image.

Second Embodiment

The second embodiment of the invention will be described. The second embodiment provides correction for the first embodiment so that a heightwise variation other than an elevation difference in the circuit pattern of the sample 29 (e.g., a macroscopic height variation due to the warpage of a semiconductor wafer) does not affect a height variation inspection result.

A mirror projection inspection system according to the second embodiment additionally provides the first embodiment shown in FIG. 2 with: a standard preparation for height correction mounted on the holder independently of the sample 29; and a height sensor for measuring heights of the sample 29 and the standard preparation for height correction mounted on the holder 211.

The height sensor can measure an average height of a region sized to several micrometers to several nanometers. This resolution is lower than a defective region the mirror projection inspection system can detect within a plane for the sample 29 and the standard preparation for height correction. In this manner, it is possible to detect a macroscopic height variation of the sample 29 (e.g., the warpage of approximately several hundreds of micrometers of a semiconductor wafer). For example, an optical height inspection system (Z sensor) can be used for such height sensor.

Figure 10A:
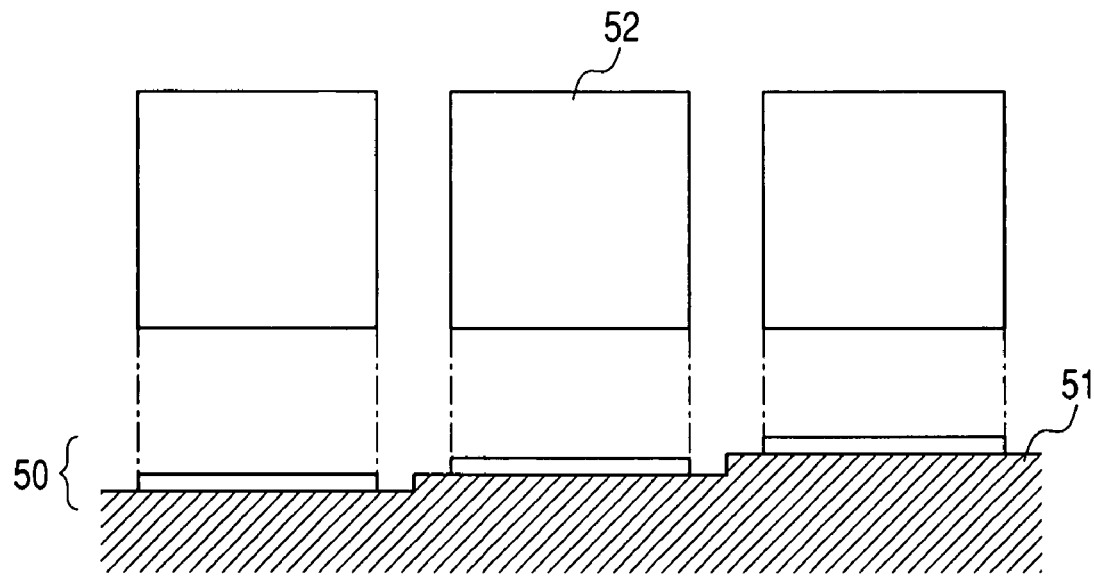
FIG. 10A schematically shows a standard preparation example for height correction (front view and bottom view) and FIG. 10B schematically shows an example of a standard sample 52 constructing the standard preparation for height correction (front view, bottom view, and side view)

FIG. 10A schematically shows a standard preparation example for height correction (front view and bottom view). As shown in FIG. 10A, the standard preparation for height correction is provided with multiple steps 50 on the surface. Each step surface 51 is provided with a standard sample 52. A height from the reference point of the holder 211 to each standard sample 52 is highly accurately measured when the standard preparation for height correction is mounted on the holder 211. While the example provides the three standard samples 52 on the different step surfaces 51, the number of the standard samples 52 is obviously not limited thereto.

Figure 10B:
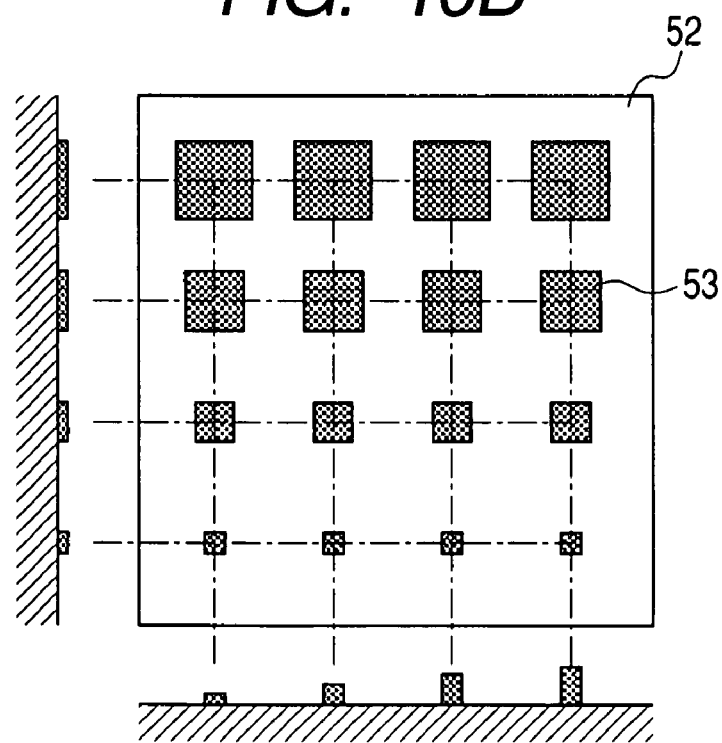

FIG. 10B schematically shows an example of the standard sample 52 constructing the standard preparation for height correction (front view, bottom view, and side view). As shown in FIG. 10B, the standard sample 52 includes a matrix of test pieces 53 with different sizes and heights. In this example, each row contains the test pieces 53 of the same size. Each column contains the test pieces 53 of the same height. The differently sized test pieces 53 are used because focus conditions of the electro-optic system 20 vary with different sizes despite the same height. When the sample 29 is a semiconductor wafer, for example, the size of the test piece 53 may comply with a semiconductor process design rule.

The following describes a correction amount calculation process of the electro-optic system 20 using the above-mentioned standard preparation for height correction.

Figure 11:
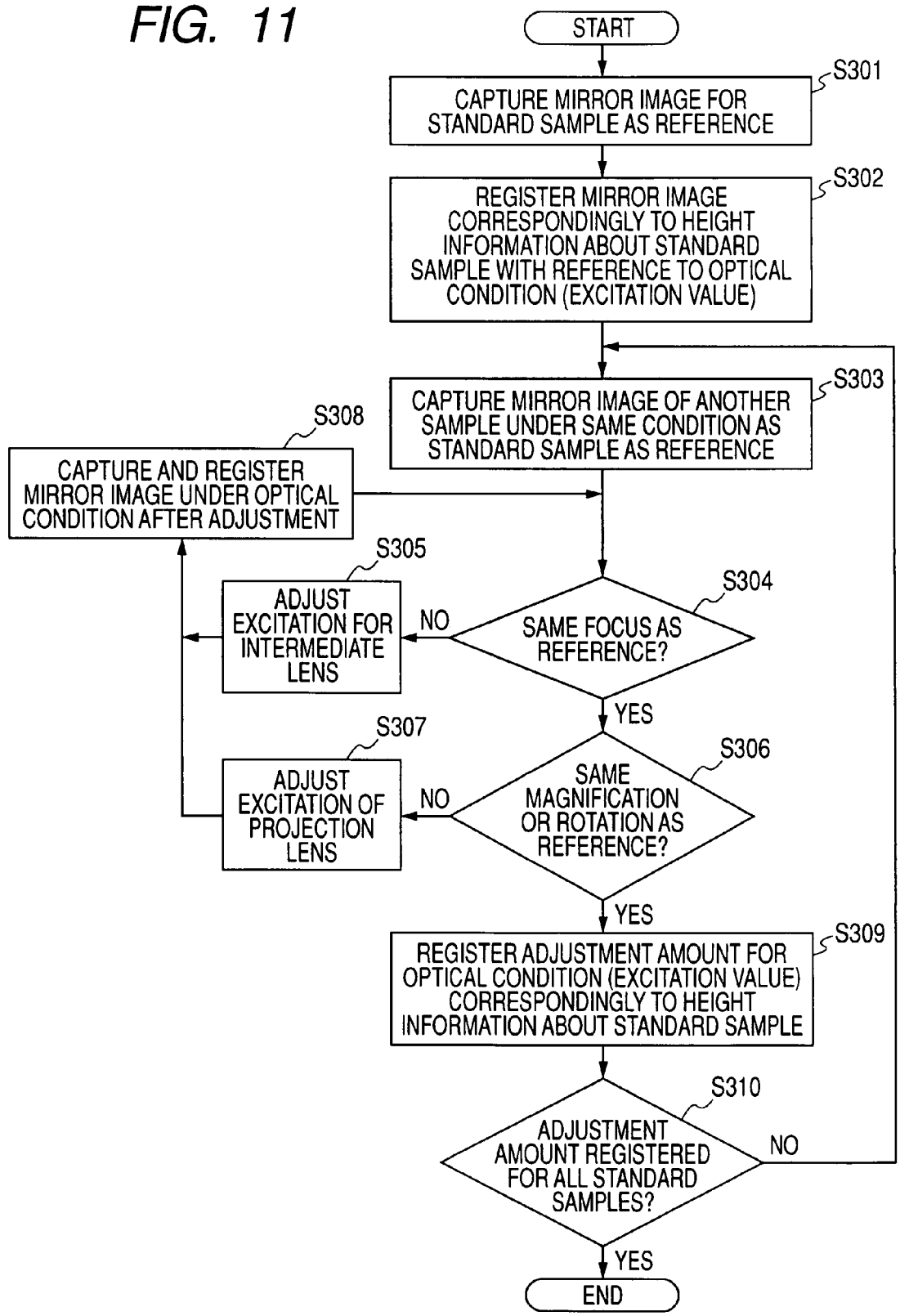
FIG. 11 shows a flowchart for explaining an electro-optic correction amount calculation process of a mirror projection inspection system according to a second embodiment of the invention.

FIG. 11 shows a flowchart for explaining an electro-optic correction amount calculation process of the mirror projection inspection system according to the second embodiment of the invention.

The system control unit 26 controls the charge control unit 23, the stage control unit 24, the electro-optic system control unit 25, and the image processing unit 27 to capture a mirror image for each of the differently sized test pieces 53 of the standard sample 52 as a reference (Step S301).

The contrast and the size of a defect in a mirror image can be changed to any values by adjusting the excitation of the objective lens 2022. The operator can adjust the excitation of the objective lens 2022 so as to emphasize an intended elevation difference of the standard sample 52. The excitation of the objective lens 2022 can be adjusted so that the mirror image contrast continuously varies in accordance with heights of the test pieces 53 of the same size. For example, let us suppose that the sample 29 is a semiconductor wafer having a 100 nm half-pitch circuit pattern. In such case, it is preferable to adjust the excitation of the objective lens 2022 so that the test piece 53 sized to 100 nm continuously varies the contrast of the mirror image in accordance with the height.

The system control unit 26 receives mirror images of the equally sized test pieces 53 from the image processing unit 27. The system control unit 26 registers the mirror images correspondingly to optical conditions for capturing the mirror images, the height information about the standard sample 52 as the reference previously registered in the memory, and the size information about the test piece 53 (Step S302).

The system control unit 26 controls the charge control unit 23, the stage control unit 24, the electro-optic system control unit 25, and the image processing unit 27 to capture mirror images of the test pieces 53 having the same size as the test pieces 53 captured at Step S301 under the same optical condition as for the standard sample 52 as the reference (Step S303). When receiving the captured mirror images from the image processing unit 27, the system control unit 26 transmits the mirror images of these test pieces 53 and the mirror images of the test pieces 53 for the standard sample 52 registered at Step S303 as the reference to the console terminal 28. The console terminal 28 displays these mirror images and allows the operator to determine the necessity of adjusting optical conditions (Steps S304 to S308). The operator compares the contrast of the mirror image for the standard sample 52 as the reference with that of the mirror image for the standard sample 52 to be compared. When both differ from each other (NO at Step S304), the operator adjusts the excitation of the intermediate lens 2031 (Step S305). The system control unit 26 captures a mirror image under the adjusted optical condition (Step S308) and returns to Step S304. This process is repeated until the contrasts for both become equal to each other.

The operator then compares the magnification and the rotation of the mirror image for the standard sample 52 as the reference with those of the mirror image for the standard sample 52 to be compared. When both differ from each other (NO at Step S306), the operator adjusts the excitation of the projection lens 2032 (Step S307). The system control unit 26 captures a mirror image under the adjusted optical condition (Step S308) and returns to Step S304. This process is repeated until the magnifications and the rotations for both become equal to each other.

Let us suppose that the mirror image for the standard sample 52 to be compared becomes equal to the mirror image for the standard sample 52 as the reference in terms of all of the contrast, the magnification, and the rotation (YES at Steps S304 and S306). The system control unit 26 registers the optical condition in such case correspondingly to the height information about the standard sample 52 to be compared and the size information about the test piece 53 registered in the memory (Step S309).

When finishing registering optical conditions for all the standard samples 52 (YES at Step S310), the system control unit 26 terminates the process flow. Otherwise (NO at Step S310), the system control unit 26 returns to Step S303 and continues the process.

Figure 12:
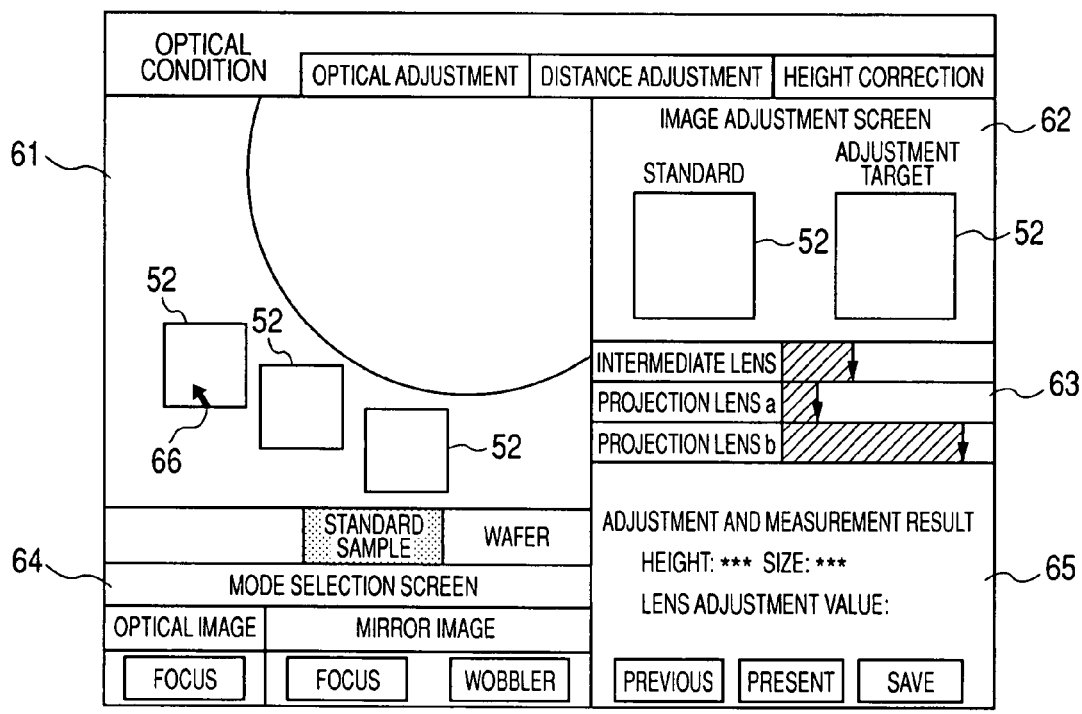
FIG. 12 exemplifies an optics adjustment GUI screen displayed on the console terminal 28 during the electro-optic correction amount calculation process in FIG. 11.

FIG. 12 exemplifies an optics adjustment GUI screen displayed on the console terminal 28 during the electro-optic correction amount calculation process in FIG. 11.

As shown in FIG. 12, the optics adjustment GUI screen includes: a layout display window 61 indicating an approximate position of the holder 211; a sample image display window 62 for displaying images of the standard sample 52 as the reference and the standard sample 52 to be adjusted; a parameter adjustment pane 63 for setting parameters of the electro-optic system 20; an image mode pane 64 for accepting an instruction to change the image mode for the standard sample 52; and a registration pane 65 for displaying and registering the height of the standard sample 52 to be adjusted, the size of the test piece 53, and the setup parameter value for the electro-optic system 20.

The layout display window 61 is used for specifying the standard sample 51. The operator operates a pointer 66 using a pointing device such as a mouse to specify a measurement location of the standard sample 52 as the reference. The console terminal 28 transmits the measurement location specified by the pointer 66 to the system control unit 26. The system control unit 26 controls the stage control unit 24, the optical microscope 213, and the image processing unit 27 to acquire an optical image or a mirror image at the measurement location specified by the pointer 66 and transmits the image to the console terminal 28. The console terminal 28 allows the sample image display window 62 to display the acquired image data for the standard sample 52 as the reference. Similarly, the operator operates the pointer 66 using the pointing device such as a mouse to specify a measurement location of the standard sample 52 to be adjusted. The console terminal 28 transmits the measurement location specified by the pointer 66 to the system control unit 26. The system control unit 26 controls the stage control unit 24, the optical microscope 213, and the image processing unit 27 to acquire an optical image or a mirror image at the measurement location specified by the pointer 66 and transmits the image to the console terminal 28. The console terminal 28 allows the sample image display window 62 to display the acquired image data for the standard sample 52 to be adjusted.

The sample image display window 62 displays image data for the standard sample 52 as the reference and image data for the standard sample 52 to be adjusted side by side. When a parameter for the electro-optic system 20 is adjusted, the image data for the standard sample 52 to be adjusted is updated each time the parameter value is updated in the parameter adjustment pane 63.

The parameter adjustment pane 63 contains scale bars for adjusting various lens parameters of the electro-optic system 20. When the operator operates the scale bar using the pointing device such as a mouse, the console terminal 28 transmits various lens parameter values indicated by the scale bars for the electro-optic system 20 to the system control unit 26. The system control unit 26 receives the parameter values from the console terminal 28, transmits them to the electro-optic system control unit 25, and allows the electro-optic system control unit 25 to adjust the electro-optic system 20. This process adjusts the image data for the standard sample 52 to be adjusted. By adjusting the scale bar, the operator can equalize the image data for the standard sample 52 to be adjusted with the image data for the standard sample 52 as the reference.

The image mode pane 64 includes: a focus button for selecting an optical image; a focus button for selecting a mirror image; and a wobble button for accepting adjustment of the electro-optic system 20. When the operator uses the pointing device such as a mouse to operate the focus button for selecting an optical image, the console terminal 28 transmits an optical image acquisition instruction to the system control unit 26. The system control unit 26 receives the instruction and controls the optical microscope 213 to capture an optical image. The optical image is transmitted to the system control unit 26 via the image processing unit 27. The system control unit 26 transmits the optical image to the console terminal 28. When the operator uses the pointing device such as a mouse to operate the focus button for selecting a mirror image, the console terminal 28 transmits a mirror image acquisition instruction to the system control unit 26. The system control unit 26 receives the instruction and controls the electro-optic system 20 to capture a mirror image. The mirror image is transmitted to the system control unit 26 via the image processing unit 27. The system control unit 26 transmits the mirror image to the console terminal 28. When the operator uses the pointing device such as a mouse to operate the wobbler button, the console terminal 28 activates the parameter adjustment pane 63 to be ready for accepting an adjustment of parameters for the electro-optic system 20 from the operator.

The registration pane 65 includes: a present value button for displaying the height of the standard sample 52 to be adjusted, the size of the test piece 53, and the setup parameter value for the electro-optic system 20; a previous value button for displaying the most recently registered setup parameter value for the electro-optic system 20; and a save button for registering the height of the standard sample 52 to be adjusted, the size of the test piece 53, and the setup parameter value for the electro-optic system 20. When the operator operates the save button using the pointing device such as a mouse, the console terminal 28 transmits the height of the standard sample 52 to be adjusted, the size of the test piece 53, and the setup parameter value (optical condition) for the electro-optic system 20 to the system control unit 26. In response to this, the system control unit 26 stores these pieces of information as correction information for macroscopic height variations in the memory.

The following describes an inspection recipe creation process and a height variation detection process of the mirror projection inspection system according to the embodiment.

In the inspection recipe creation process according to the embodiment, the height sensor measures the height of the sample 29 at Step S111 (accepting and registering the height variation inspection template) in the inspection recipe creation process according to the first embodiment as shown in FIG. 3. The system control unit 26 allows the electro-optic system control unit 25 to control the electro-optic system 20 for capturing a mirror image using optical conditions that are registered to the memory correspondingly to the height and the size of the circuit pattern for the sample 29. The other parts are the same as those of the inspection recipe creation process according to the first embodiment.

In the height variation detection process according to the embodiment, the height sensor measures the height of the sample 29 at Step S211 (height variation inspection) in the height variation detection process according to the first embodiment as shown in FIG. 6. The system control unit 26 allows the electro-optic system control unit 25 to control the electro-optic system 20 for capturing a mirror image using optical conditions that are registered to the memory correspondingly to the height and the size of the circuit pattern for the sample 29. The other parts are the same as those of the height variation detection process according to the first embodiment as shown in FIG. 6.

There has been described the second embodiment of the invention.

In addition to the effect of the first embodiment, the second embodiment can provide correction so that a heightwise variation other than an elevation difference in the circuit pattern of the sample 29 (e.g., a macroscopic height variation due to the warpage of a semiconductor wafer) does not affect a height variation inspection result.

Third Embodiment

The third embodiment of the invention will be described. The embodiment allows the use of the AFM for measuring an elevation difference in the circuit pattern of the sample 29 in the first or second embodiment mentioned above.

Figure 13:
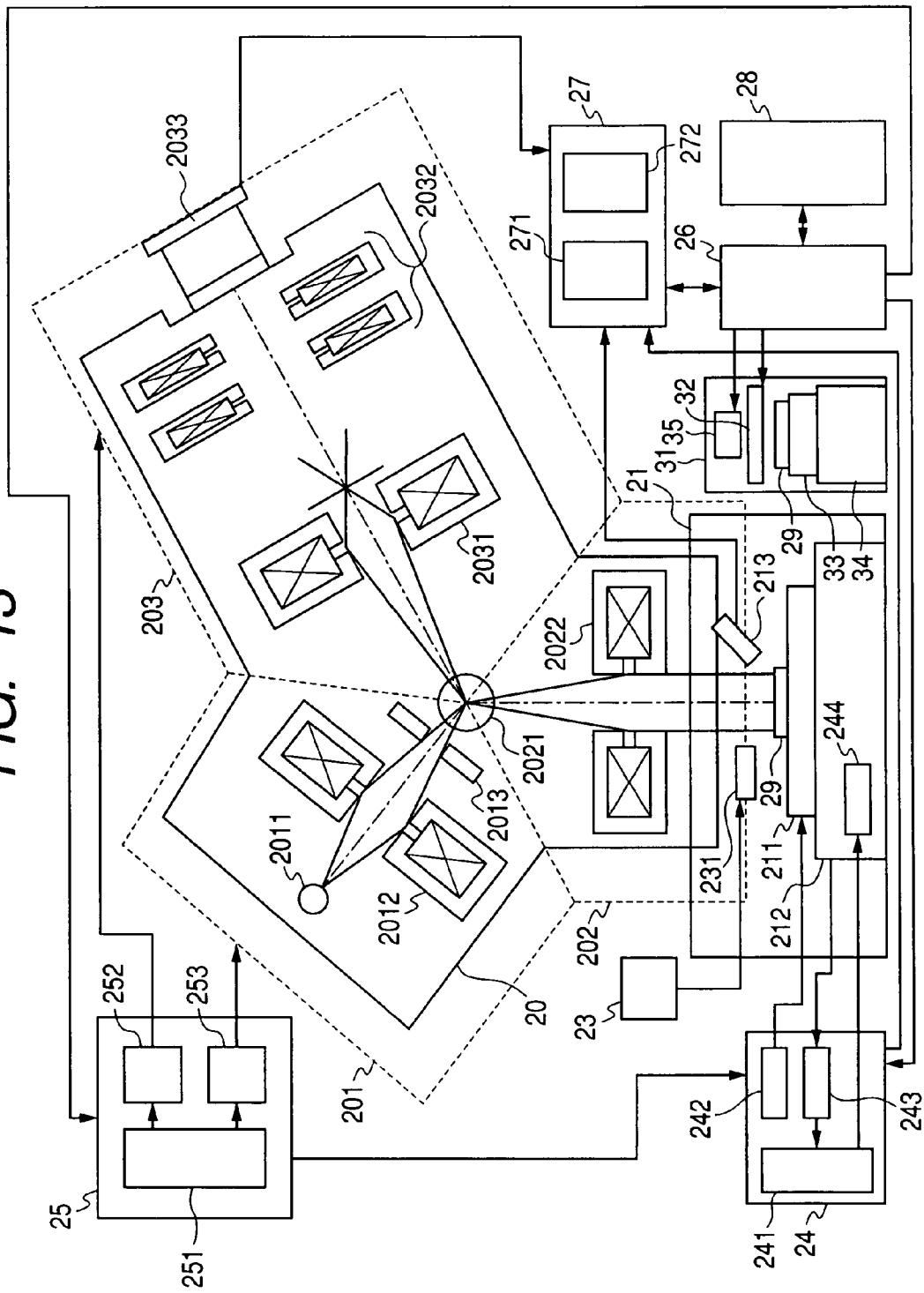
FIG. 13 schematically shows a mirror projection inspection system according to a third embodiment of the invention.

FIG. 13 schematically shows a mirror projection inspection system according to a third embodiment of the invention. As shown in FIG. 13, the mirror projection inspection system according to the embodiment adds a sample chamber for AFM 31 to the first embodiment in FIG. 2 or the second embodiment.

A sample chamber 31 includes: an AFM 32; a holder 33 for mounting the sample 29; a stage 34 for moving the sample 29 perpendicularly to a needle of the AFM 32; an optical microscope for AFM 35; a transport unit (not shown) for transporting the sample 29 from the holder 211 to the holder 33; and a stage control unit (not shown) for controlling the stage 34. Unlike the sample chamber 21, the sample chamber 31 need not be evacuated. The inside of the sample chamber 31 may be equal to the atmospheric environment.

The AFM 32 scans a specimen surface using a fine needle with a tip curvature of sub-micrometers. The AFM images a heightwise travel distance of the needle in synchronization with the scanning to measure the specimen's heightwise shape. An existing apparatus may be used for the AFM 32. The optical microscope for AFM 35 is used for finding a location to be measured by the AFM 32.

The following describes an inspection process of the mirror projection inspection system according to the third embodiment of the invention. The inspection process of the mirror projection inspection system according to the embodiment can be divided into a height variation inspection process using a mirror image and an elevation difference review process using the AFM.

Figure 14B:
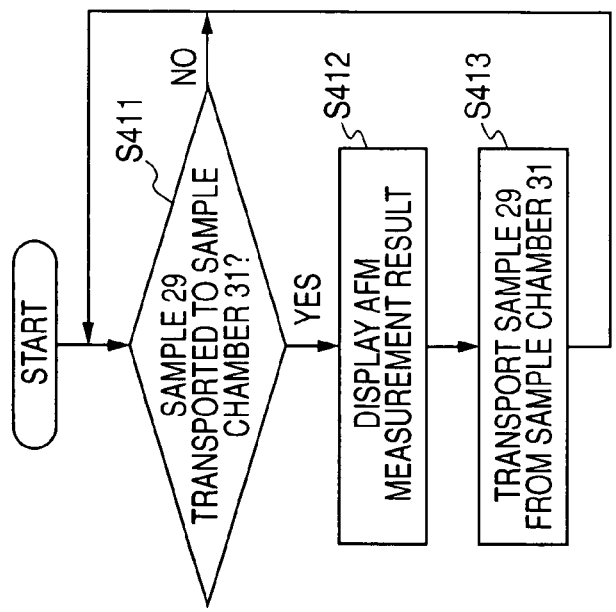
FIG. 14A shows a flowchart for explaining a height variation inspection process of the mirror projection inspection system according to the third embodiment of the invention and FIG. 14B shows a flowchart for explaining an elevation difference review process using the AFM for the mirror projection inspection system according to the third embodiment of the invention.
Figure 14A:
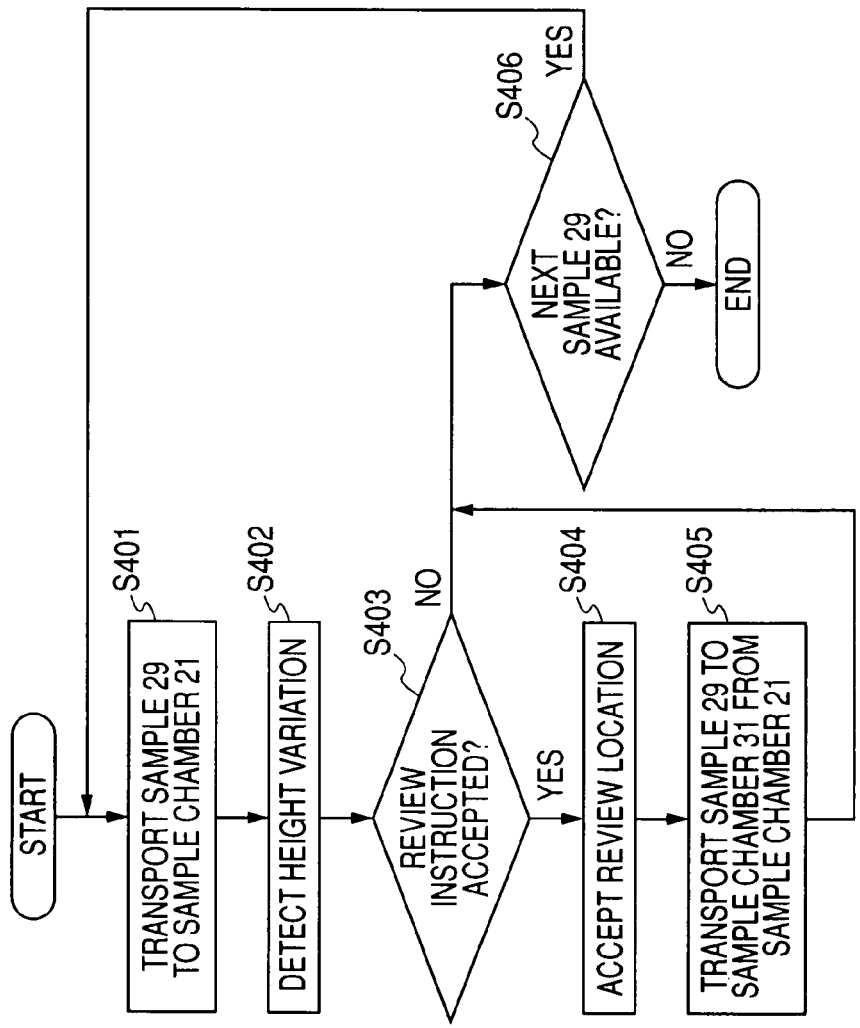

FIG. 14A shows a flowchart for explaining a height variation inspection process of the mirror projection inspection system according to the third embodiment of the invention. FIG. 14B shows a flowchart for explaining an elevation difference review process using the AFM for the mirror projection inspection system according to the third embodiment of the invention.

The height variation inspection process will be described with reference to FIG. 14A. The transport unit (not shown) transports the sample 29 into the sample chamber 21. The sample 29 is mounted on the holder 211 (Step S401). The system control unit 26 performs the process flow in FIG. 6 to inspect a height variation in the sample 29 (Step S402). The system control unit 26 outputs an inspection result to the console terminal 28 and accepts the necessity of a review using the AFM from the operator (Step S403).

When a response received from the console terminal 28 indicates that a review using the AFM is needed (YES at Step S403), the system control unit 26 receives specification about a review location in the sample 29 (e.g., specification of a mirror image for the review location) from the operator via the console terminal 28. The transport unit (not shown) transports the sample 29 from the sample chamber 21 to the sample chamber 31 (Step S405).

When a response received from the console terminal 28 indicates that a review using the AFM is not needed (NO at Step S403), the system control unit 26 behaves as follows. When the sample 29 remains (YES at Step S406), the system control unit 26 returns to Step S401. Otherwise (NO at Step S406), the system control unit 26 terminates the process flow.

With reference to FIG. 14B, the following describes the elevation difference review process. The transport unit (not shown) transports the sample 29 into the sample chamber 31. The sample 29 is mounted on the holder 33 (Step S411). The system control unit 26 controls the stage control unit (not shown) to move the stage 34 and allows the AFM 32 to measure an elevation difference at the review location of the sample 29 accepted at Step S404. The system control unit 26 transmits a measurement result together with the mirror image for the review location acquired through the process flow in FIG. 4A to the console terminal 28. In response to this, the console terminal 28 displays the mirror image for the review location and the measurement result (Step S412). It is assumed that a coordinate system of the stage 212 correlates with to that of the stage 34 in advance.

The following describes adjustment of the correlation between the coordinate system of the stage 212 and that of the stage 34.

The height variation inspection using the mirror projection technique corrects coordinates of the stage 212 and the sample 29 mounted on the holder 211 and corrects coordinates of the optical microscope 213 and the electro-optic system 20. The coordinate correction between the stage 212 and the sample 29 mounted on the holder 211 aims at correcting a positional displacement occurring when the sample 29 is mounted on the holder 211. The above-mentioned alignment process measures coordinate correction values (dxiopt, dyiopt). This process needs to be performed each time the sample 29 is mounted on the holder 211. The coordinate correction between the optical microscope 213 and the electro-optic system 20 aims at measuring a relative distance between both. This process need not be performed each time the sample 29 is replaced. This relative distance is measured when the optical microscope 213 and the electro-optic system 20 are adjusted. Coordinate correction values (dxiopt, dyiopt) for the stage 212 and the sample 29 mounted on the holder 211 are stored as part of an inspection recipe file for the sample 29. Coordinate correction values (dxins, dyins) for the optical microscope 213 and the electro-optic system 20 are stored as adjustment data for the mirror projection inspection system. These values are independently stored in the memory of the system control unit 26, for example.

The elevation difference measurement using the AFM also performs the coordinate correction between the stage 34 and the sample 29 mounted on the holder 33 and the coordinate correction between the optical microscope for AFM 35 and the AFM 32. The coordinate correction between the stage 34 and the sample 29 mounted on the holder 33 aims at correcting a positional displacement occurring when the sample 29 is mounted on the holder 33. A process similarly to the above-mentioned alignment process measures coordinate correction values (dxaopt, dyaopt) This process needs to be performed each time the sample 29 is mounted on the holder 33. The coordinate correction between the optical microscope for AFM 35 and the AFM 32 aims at measuring a relative distance between both. This process need not be performed each time the sample 29 is replaced. This relative distance is measured when the optical microscope 35 and the AFM 32 are adjusted. Coordinate correction values (dxaopt, dyaopt) for the stage 34 and the sample 29 mounted on the holder 33 are stored as part of an inspection recipe file for the sample 29. Coordinate correction values (dxafm, dyafm) for the optical microscope for AFM 35 and the AFM 32 are stored as adjustment data for the AFM. These values are independently stored in the memory of the system control unit 26, for example.

The stage position measuring device 241 measures the coordinate of the stage 211 to yield (Xi+dxiopt+dxins, Yi+dyiopt+dyins). Saving the above-mentioned correction values (dxiopt, dyiopt) and (dxins, dyins) enables calculation of the correction coordinate (Xi, Yi) for the stage 241. When the review process is performed using the AFM, the process assumes correction coordinate (Xi, Yi) for the stage 211 to be coordinate (Xa, Ya) for the stage 34 and uses the above-mentioned correction values (dxaopt, dyaopt) and (dxafm, dyafm) to calculate a correction coordinate for the stage 34. In this manner, the review process using the AFM is made possible based on the coordinate for a defect portion detected by the height variation inspection.

When the review process terminates, the transport unit (not shown) transports the sample 29 from the sample chamber 31 (Step S413). The process returns to Step S411 and waits until the new sample 29 to be reviewed is transported into the sample chamber 31 (Step S411).

Figure 15:
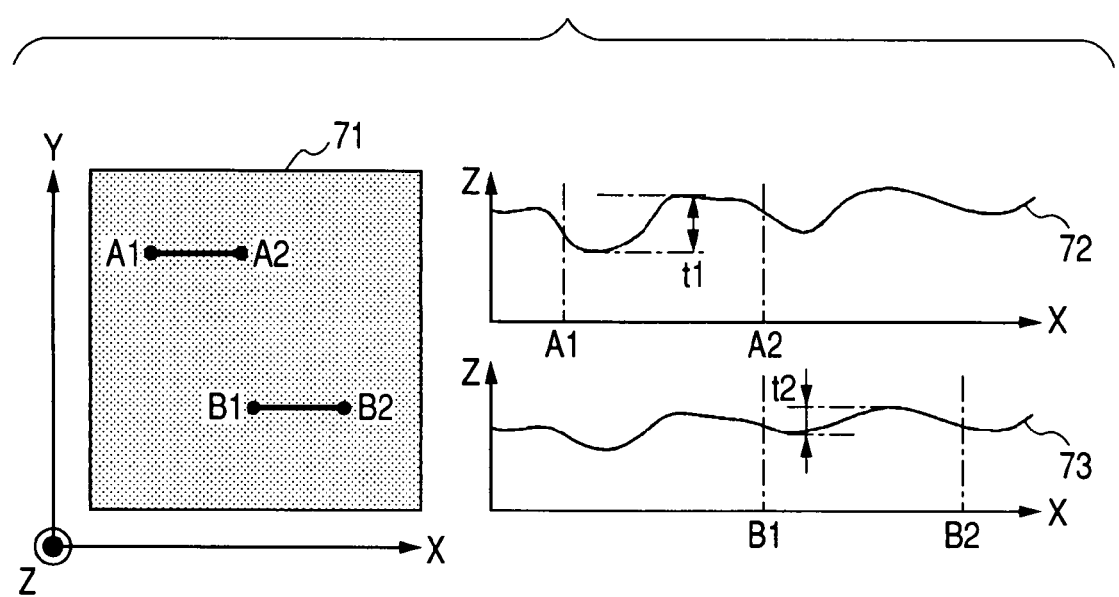
FIG. 15 schematically shows a mirror image for a review location and a measurement result.

FIG. 15 schematically shows a mirror image for a review location and a measurement result. Reference numeral 71 denotes a mirror image for a review location. Reference numeral 72 denotes a graph (line profile) representing a result of the AFM-based measurement for an elevation difference between sections A1 and A2 in the mirror image 71. Reference numeral 73 denotes a graph (line profile) representing a result of the AFM-based measurement for an elevation difference between sections B1 and B2 in the mirror image 71. The contrast of the mirror image 71 is measured as an elevation difference on the surface of the sample 29 in the line profiles 72 and 73. According to this measurement result, the operator can confirm the elevation difference on the surface of the sample 29 where the height variation detection process detects a height variation in the circuit pattern.

Figure 16A:
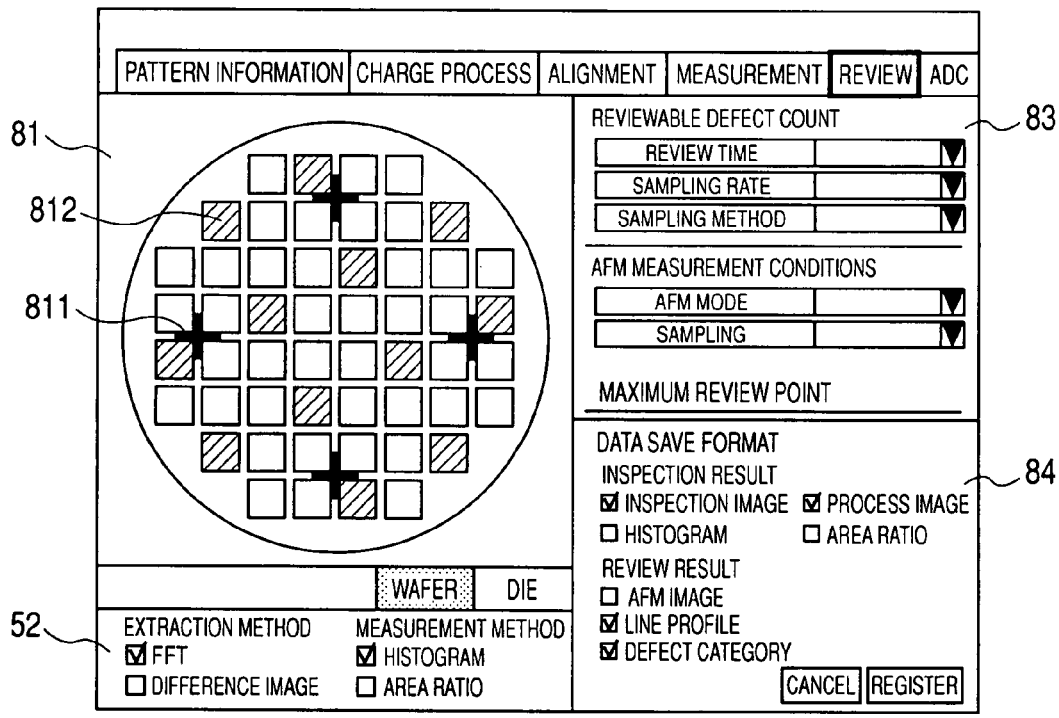
FIG. 16 exemplifies review GUI screens displayed on the console terminal 28 during the processes in FIGS. 14A and 14B.
Figure 16B:
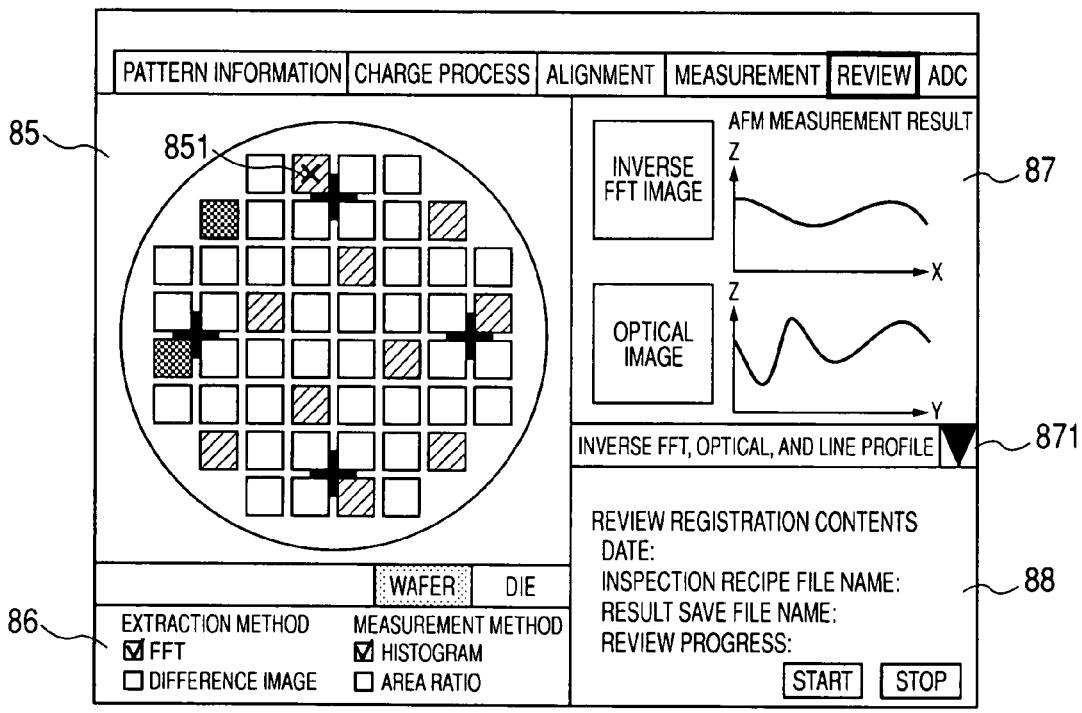

FIG. 16 exemplifies review GUI screens displayed on the console terminal 28 during the processes in FIGS. 14A and 14B. FIG. 16A exemplifies a review condition setup GUI screen for specifying review conditions at Step S404 in FIG. 14A. FIG. 16B exemplifies a review result display GUI screen for specifying review conditions at Step S412 in FIG. 14B.

As shown in FIG. 16A, the review condition setup GUI screen includes: a layout display window 81 indicating a position of a region to be reviewed; an image processing specification pane 82 for specifying the extraction method and the measurement method for height variations; a review condition setup pane 83 for setting a review condition; and a registration pane 84 for registering a result.

The layout display window 81 displays an inspection region 811 and an alignment position 812 for a height variation. The image processing specification pane 82 unchangedly displays the result entered by the operator when the inspection recipe was created.

The review condition setup pane 83 includes: an input pane for accepting the review time (maximum time allowable for a review); an input pane for accepting a sampling ratio (a ratio of defects to be reviewed to all defects detected by the height variation inspection process); an input pane for accepting a sampling method (a method of sampling a defect detected by the height variation inspection process); an input pane for accepting a sampling count (the number of defects to be reviewed); and a display pane for displaying the number of reviewable defects (maximum review score).

The maximum review score depends on the review time, the sampling ratio, and the sampling count. When an operator-specified sampling ratio can be used to review all defects to be reviewed, the maximum review score results from multiplying the sampling count by the sampling ratio. There may be a case where the console terminal 28 cannot review all defects to be sampled at the operator-specified sampling ratio within the review time. In such case, the system control unit 26 automatically adjusts the sampling ratio so as to be able to review all the defects to be sampled within the review time. When "Random" is specified for the sampling method, the system control unit 26 performs a review by randomly determining a defect to be reviewed from all the defects detected by the height variation inspection process. When "Specific die" is specified, the system control unit 26 automatically adjusts the sampling ratio so that the review terminates within a specified time for the specified die only. The operator can freely create a command to be specified for the sampling method. Appropriately selecting the sampling method can perform an effective review in a shorter time.

The registration pane 84 includes checkboxes for enabling a save method for the height variation method and the AFM-based review result. The system control unit 26 accepts the save method (data format) from the operator via the registration pane 84 displayed on the console terminal 28. According to the accepted save method, the system control unit 26 registers the height variation method and the AFM-based review result in the memory.

As shown in FIG. 16B, the review result display GUI screen includes: a layout display window 85 for indicating a review position; an image processing specification pane 86 for specifying the extraction method and the measurement method for height variations; a result display window 87 for realtime displaying a measurement result; and an attribute display window 88 for displaying attribute information.

The layout display window 85 displays a review position 851 of the sample 29. The system control unit 26 transmits positional information under review to the console terminal 28. The console terminal 28 uses the layout display window 85 to display a review position 911 specified by the positional information transmitted from the system control unit 26. The layout display window 85 may display a region specified in the inspection recipe so that the region can be identified. The image processing specification pane 86 displays the result entered by the operator when the inspection recipe was created.

The result display window 87 is provided with a selection pane 871 for selecting the type of a result displayed in the result display window 87. Using the selection pane 871, the operator can select any multiple images from "Mirror image," "Inverse FFT image," "Optical image," "Histogram," "AFM image," and "Lineprofile." The system control unit 26 allows the console terminal 28 to realtime display a result selected by the operator in the result display window 87. According to the example in FIG. 16B, the result display window 87 displays three types of results: "Inverse FFT image" acquired by the height variation inspection process, "Optical image" using the AFM optical microscope 35, and "Line profile" using the AFM 33.

The attribute display window 88 displays a date to perform the review, a file name of the inspection recipe, a file name for saving the inspection result, and a review progress. These pieces information are transmitted from the system control unit 26 to the console terminal 28. The attribute display window 88 is provided with instruction buttons for accepting instructions to start and stop the review from the operator.

There has been described the third embodiment of the invention.

In addition to the effect of the first embodiment, the third embodiment can confirm an elevation difference in the sample 29 where a height variation is detected.

Fourth Embodiment

The fourth embodiment describes a case of applying the mirror projection inspection system according to any of the above-mentioned first through third embodiments to an inline process monitor.

Figure 17:
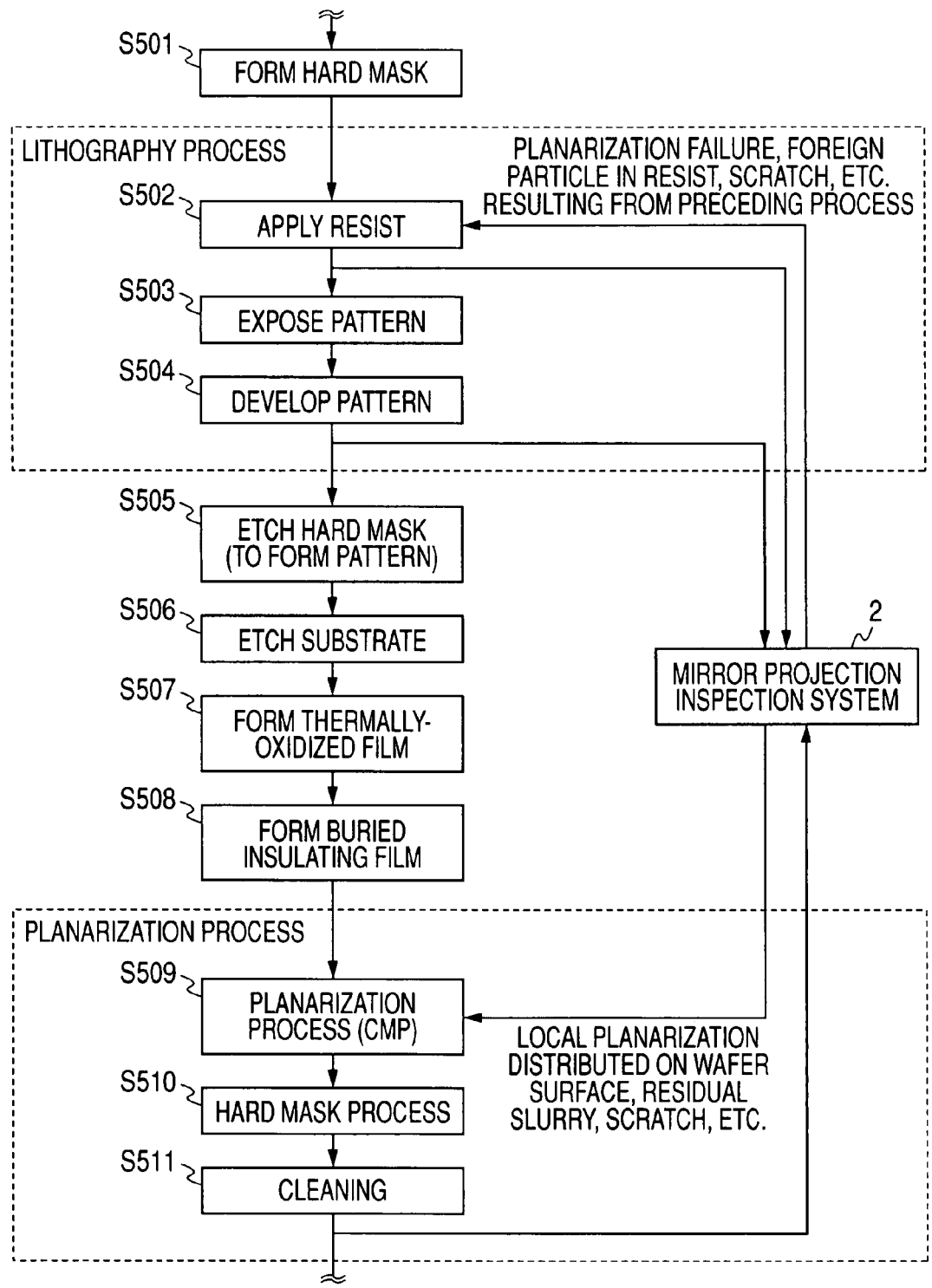
FIG. 17 exemplifies a semiconductor device manufacturing process.

FIG. 17 exemplifies a semiconductor device manufacturing process. This example simplifies Steps S501 through S511 from the pattern formation on a substrate to the planarization process after forming a buried insulating film in the Shallow Trench Isolation (STI) process. The embodiment describes the case of applying the mirror projection inspection system according to any of the above-mentioned first through third embodiments to a lithography process (Steps S502 to S504) for forming a pattern and to a planarization process (Steps S509 to S511) after forming a buried insulating film in the semiconductor manufacturing process in FIG. 17.

The following outlines the semiconductor device manufacturing process in FIG. 17.

The process forms a hard mask used for substrate etching (Step S501). The hard mask is also used as an endpoint indicator (stopper) for Chemical and Mechanical Polishing (hereafter acronymed as CMP) in the planarization process (Steps S509 to S511). The process applies a resist (Step S502), exposes a pattern using a stepper (Step S503), and removes the resist from a location to be etched by a developing process (Step S504). The pattern is formed on the substrate surface up to the steps so far.

The process etches the location removed of the resist to remove the hard mask (Step S505) and etches the substrate (Step S506). The process forms an oxide film (Step S507) and buries an insulating material (Step S508).

Finally, the process performs a CMP-based planarization process (Step S509), removes the hard mask by means of wet etching (Step S510), performs cleaning (Step S511), and advances the wafer to the next step.

The following describes a case of applying the mirror projection inspection system according to any of the above-mentioned first through third embodiments to the lithography process (Steps S502 to S504).

The lithography process (Steps S502 to S504) is subject to problems such as incorporation of fine particles in the applied resist (foreign particles in a film), a scratch on the resist surface, and an irregular surface. These problems may degrade an exposure resolution. A foreign particle in the film or an irregular surface can be detected by inspecting a height variation using the mirror projection inspection system according to any of the first through third embodiments in a process after the resist application or the developing process. When an inspection result is fed back to the resist application process, it is possible to implement a function of monitoring the semiconductor manufacturing process.

The following describes a case of applying the mirror projection inspection system according to any of the first through third embodiments to the planarization process (Steps S509 to S511). The fourth embodiment describes inspection of a height variation using the mirror projection inspection system according to any of the first through third embodiments at the cleaning step after the planarization step according to the CMP process. Further, a height variation can be inspected using the mirror projection inspection system according to any of the first through third embodiments at a non-CMP planarization step such as an etch-back step.

The cleaning step S511 is subject to such problems as residual slurry used for the CMP process, a scratch occurring during the CMP process, and local irregularities on the substrate surface resulting from the substrate pattern. These problems may degrade the resolution in the subsequent lithography process or may cause an electric characteristic failure in a completed device. Similarly to the above-mentioned lithography process, the semiconductor manufacturing process can be highly accurately managed by inspecting a height variation using the mirror projection inspection system according to any of the first through third embodiments in the planarization process. For example, residual slurry may result from the cleaning process. When residual slurry is detected, the cleaning process needs to be inspected. On the other hand, a scratch or an irregular surface may result from the CMP process. When these anomalies are detected, the CMP process needs to be inspected.

The mirror projection inspection system according to any of the first through third embodiments can be used to detect these failures and feed back a result to the semiconductor manufacturing process. In this manner, the semiconductor manufacturing process in a developmental stage can improve the yield. The semiconductor manufacturing process in a mass production stage can early find the yield degradation. There is concern that the electron beam radiation degrades resist materials and low-k materials used for the present semiconductor manufacturing process. The mirror projection inspection system is advantageous to such situation because it returns an electron beam very close to the wafer surface to prevent a material from being degraded. That is, a damageless inline process monitor can be implemented by using the mirror projection inspection system according to any of the first through third embodiments.

Figure 18A:
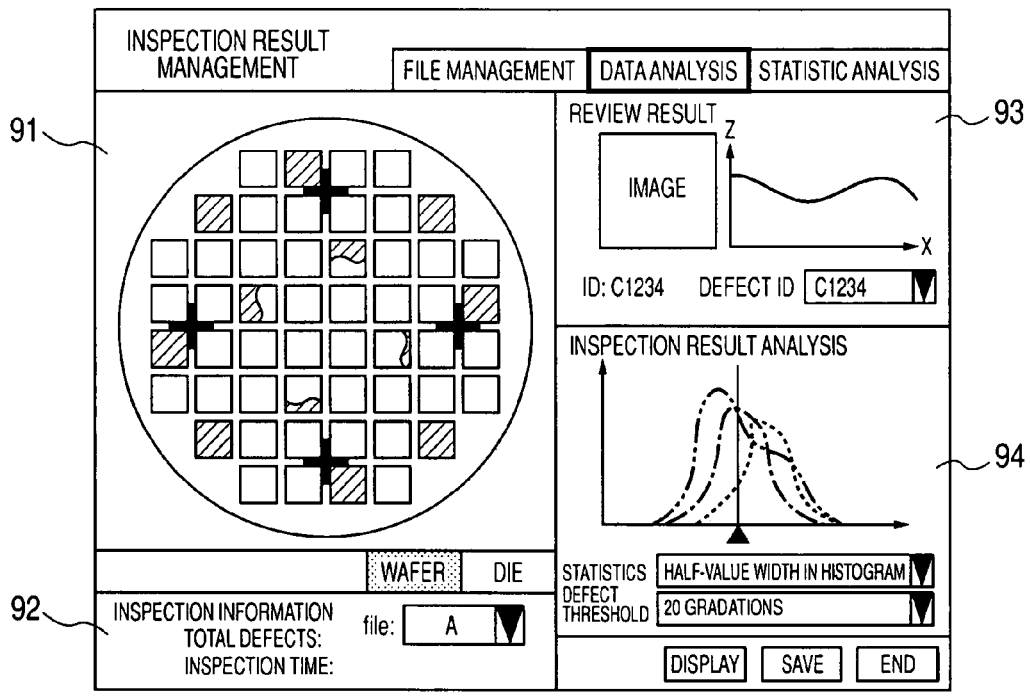
FIG. 18A is a GUI screen for analyzing one inspection result and FIG. 18B is a GUI screen for statistically analyzing inspection results from the same process.
Figure 18B:
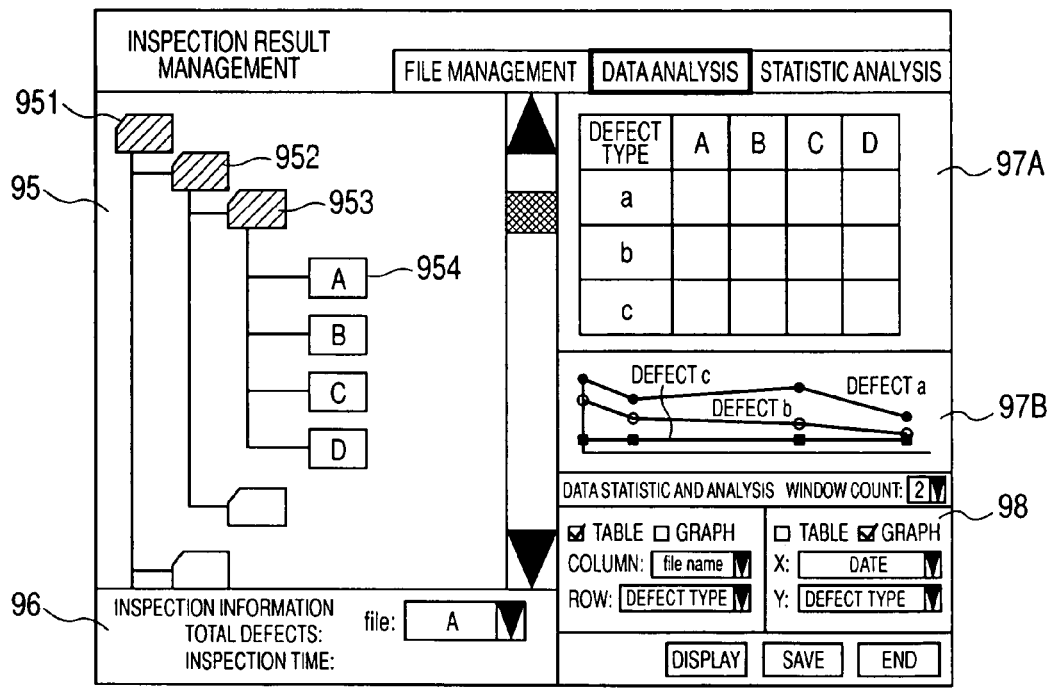

FIG. 18 exemplifies data management GUI screens displayed on the console terminal 28 during data management of inspection results. FIG. 18A is a GUI screen for analyzing one inspection result. This screen is suitable for the semiconductor manufacturing process in a developmental stage where it is necessary to analyze inspection results in detail and early detect a manufacturing process problem rather than to inspect a large quantity of wafers. FIG. 18B is a GUI screen for statistically analyzing inspection results from the same process. This screen is suitable for analyzing inspection results as a process monitor for the semiconductor manufacturing process in a mass production stage. The console terminal 28 or the system control unit 26 performs the data analysis.

As shown in FIG. 18A, the GUI screen for analyzing one inspection result includes: a layout display window 91 for indicating a position of a region under inspection; an inspection result specification pane 92 for selecting an inspection result; a review result display window 93 for displaying a review result; and an analysis result display window 94 for displaying a result of analyzing the inspection result.

The layout display window 91 displays defect distribution on the wafer surface as an inspection result. When the operator uses selection buttons provided for the layout display window 91 to select one of "Wafer" and "Die," the layout display window 91 can selectively display the entire wafer or one die.

The inspection result specification pane 92 accepts selection of a file for the inspection result to be displayed from the operator. Selecting a pull-down button in the inspection result specification pane 92 displays a list of past inspection results. The operator can select any inspection result.

The review result display window 93 displays a defect review result together with the item selected on the above-mentioned review condition setup GUI screen. In FIG. 18A, the review result display window 93 displays that the mirror image is saved and the AFM-based line profile is selected as the review condition. Selecting the pull-down button in the review result display window 93 displays a list of review results saved in the system control unit 26 correspondingly to ID numbers. The operator can select any defect to be displayed from the list.

The analysis result display window 94 displays information needed for the operator to analyze an inspection result. FIG. 18A shows the relationship between a histogram's half-value width and an occurrence frequency as information used for the analysis. The histogram's half-value width concerns the inspection result according to the filter pattern method and represents contrast variations in an acquired image region. The occurrence frequency indicates the number of regions having the same histogram's half-value width. When enabling a function to determine a defect from the mirror image acquired in the inspection, the analysis result display window 94 also displays the distribution of defects as an overlap. Referring to the analysis result display window 94 and the review result display window 93, the operator can specify any threshold value for the defect determination by sliding the marker on the graph or selecting the pull-down button. As a result, the position where a defect occurs is reflected on the defect distribution on the wafer surface in the layout display window 91.

As shown in FIG. 18B, the GUI screen for statistically analyzing an inspection result includes: a file configuration display window 95 for indicating the file configuration for an inspection result; an inspection result display window 96 for displaying an inspection result; an analysis result display window 97 for displaying an analysis result; and a statistic and analysis method selection pane 98 for selecting a data statistic and analysis method.

The file configuration display window 95 hierarchically displays inspection result files saved in the memory of the system control unit 26. FIG. 18B provides folders corresponding to brands and processes such as a root hierarchy 951, a brand folder 952, and a process folder 953. The process folder 953 contains an inspection result file 954 of the same brand and process. The operator can select the inspection result file 954 intended for analysis from the file configuration display window 95. In FIG. 18B, the inspection result files 954 "A" through "D" are selected. The analysis result display window 97 displays the analysis result.

The inspection result display window 96 is provided with a pull-down button for selecting one of the inspection result files 954 selected in the file configuration display window 95. When the operator selects the inspection result file using the pull-down button, the contents of the file are displayed.

The analysis result display window 97 displays a statistic and analysis result of the inspection result file 954 selected in the file configuration display window 95 in accordance with the statistic and analysis method selected in the statistic and analysis method selection pane 98 to be described. In FIG. 18B, the analysis result display window 97 is divided into upper and lower parts to display a statistic and analysis result in two modes. The upper part displays a table indicating the result of classifying defects corresponding to the inspection result. The lower part displays a graph indicating the relationship between the inspection date and the defect classification.

The statistic and analysis method selection pane 98 is provided with pull-down buttons and check boxes to specify a statistic and analysis method for the inspection result file to be displayed in the analysis result display window 97. Using the pull-down button, the operator can specify any number of analysis result display windows 97. Using the check box, the operator can select a table or a graph as a method of displaying the result.

There have been described the embodiments of the invention.

The present invention is not limited to the above-mentioned embodiments. It is further understood by those skilled in the art that various changes and modifications may be made in the invention without departing from the spirit and scope thereof. For example, the GUI screens in FIGS. 16 and 18 may be used for the devices described in the first through fourth embodiments. The GUI screens described in the embodiments are only examples and may include the other elements. The respective control units in the mirror projection inspection system according to each of the embodiments may be implemented on one computer system or multiple computer systems networked with each other.

What is claimed is:

1. An inspection system for inspecting a heightwise variation in a sample, comprising:
    holding means for holding a first sample;
    charging means for charging the first sample held by the holding means voltage application means for applying a voltage to the first sample held by the holding means;
    an electro-optic system that radiates an electron beam to the first sample applied with the voltage by the voltage application means and images a mirror electron returning near a surface of first the sample; and
    an image processing means for processing a first mirror image acquired by imaging the mirror electron,
    wherein the image processing means outputs information corresponding to a difference between the first mirror image acquired by the mirror electron and a second mirror image of a second sample used as a standard for determining a heightwise variation of the first sample,
    wherein the image processing means performs a first process for Fourier-transforming the first mirror image acquired by imaging the mirror electron to generate a first Fourier transform image;
    wherein the image processing means performs a second process for synthesizing the first Fourier transform image with a filter pattern for removing information about an elevation difference from a second Fourier transform image for the second mirror image to generate a composite image; and
    wherein the image processing means performs a third process for performing an inverse Fourier transform on the composite image to generate an inverse Fourier transform image and outputting the inverse Fourier transform image as the information corresponding to the difference.

2. The inspection system according to claim 1, wherein the image processing means further performs a fourth process for analyzing a spectrum of the inverse Fourier transform image to output a histogram.

3. The inspection system according to claim 1, wherein the image processing means performs a fourth process for generating a difference image representing the difference between the first mirror image the second mirror image; and
    wherein the image processing means performs a fifth process for digitizing pixels constituting the difference image to generate a digitized image and outputting the digitized image as the information corresponding to the difference.

4. The inspection system according to claim 3, wherein the image processing means further performs a sixth process for calculating and outputting a ratio of white and black pixels constituting the digitized image.

5. The inspection system according to claim 1, further comprising:
    storage means for storing an optical condition for the electro-optic system in association with information about a sample height;
    measurement means for measuring the sample height at a resolution lower than a region of the first sample having a heightwise variation identifiable from the information corresponding to the difference; and
    setup means for setting the optical condition stored in the storage means in association with the sample height measured by the measurement means for the electro-optic system.

6. The inspection system according to claim 5, further comprising a third sample used as a standard for height correction including a test piece having different heights;
    wherein the holding means further holds the third sample used as a standard for height correction; and
    wherein the storage means stores optical information in association with each height of the test piece when the electro-optic system captures a respective mirror image of each height of the test piece for the third sample used as a standard for height correction held by the holding means.

7. The inspection system according to claim 1, further comprising:
    AFM-specific holding means for holding the first sample; and
    an AFM (Atomic Force Microscopy) for measuring a heightwise shape of the first sample held by the AFM-specific holding means.

8. The inspection method according to claim 1, wherein the first sample is a semiconductor wafer in a semiconductor device manufacturing process.

9. A program readable on a computer for inspecting a heightwise variation in a sample, wherein the program allows a computer to function as:
    means for acquiring a mirror image resulting from radiating an electron beam to a sample applied with a voltage and imaging a mirror electron returning near a surface of the sample; and
    means for generating information corresponding to a difference between a mirror image acquired by imaging the mirror electron and a mirror image for a prepared standard preparation and outputting the information as a heightwise variation in the sample.

* * * * *